(12) United States Patent
Komatsuda et al.

(10) Patent No.: US 10,345,708 B2
(45) Date of Patent: Jul. 9, 2019

(54) LIGHT SOURCE APPARATUS, OPTICAL APPARATUS, EXPOSURE APPARATUS, DEVICE MANUFACTURING METHOD, ILLUMINATING METHOD, EXPOSURE METHOD, AND METHOD FOR MANUFACTURING OPTICAL APPARATUS

(71) Applicant: NIKON CORPORATION, Tokyo (JP)

(72) Inventors: Hideki Komatsuda, Tokyo (JP); Yoshio Kawabe, Tokyo (JP)

(73) Assignee: NIKON CORPORATION, Tokyo (JP)

( * ) Notice: Subject to any disclaimer, the term of this patent is extended or adjusted under 35 U.S.C. 154(b) by 0 days.

(21) Appl. No.: 15/623,749

(22) Filed: Jun. 15, 2017

(65) Prior Publication Data

US 2017/0285314 A1     Oct. 5, 2017

Related U.S. Application Data

(63) Continuation of application No. 13/639,037, filed as application No. PCT/JP2011/058189 on Mar. 31, 2011, now Pat. No. 9,703,204.

(Continued)

(51) Int. Cl.
*G02B 27/54*     (2006.01)
*G03F 7/20*      (2006.01)
*G02B 19/00*     (2006.01)

(52) U.S. Cl.
CPC ..... *G03F 7/70075* (2013.01); *G02B 19/0023* (2013.01); *G02B 19/0047* (2013.01);
(Continued)

(58) Field of Classification Search
CPC . G02B 19/0023; G02B 19/0047; G03F 7/702; G03F 7/70058; G03F 7/70066;
(Continued)

(56) References Cited

U.S. PATENT DOCUMENTS 5,594,526 A   1/1997 Mori et al.
5,636,003 A   6/1997 Tanitsu et al.
(Continued)

FOREIGN PATENT DOCUMENTS

EP   1 026 547 A2   8/2000
JP   2002-48977     2/2002
(Continued)

OTHER PUBLICATIONS

Office Action issued by the Korean Patent Office dated Jan. 16, 2017 in corresponding Korean Patent application No. 10-2012-7028634.
(Continued)

*Primary Examiner* — Christina A Riddle

(57) ABSTRACT

An optical apparatus, which illuminates a first area with light from a light source while the first area is longer in a second direction intersecting a first direction than in the first direction, includes a collector optical member which is arranged in an optical path between the light source and the first area, and condenses the light from the light source to form a second area in a predetermined plane, the second area being longer in a fourth direction intersecting a third direction than in the third direction; and a first fly's eye optical member which is provided within the predetermined plane including the second area, and has a plurality of first optical elements guiding the light of the collector optical member to the first area.

18 Claims, 15 Drawing Sheets

Related U.S. Application Data

(60) Provisional application No. 61/320,453, filed on Apr. 2, 2010, provisional application No. 61/320,443, filed on Apr. 2, 2010.

(52) U.S. Cl.
CPC ............ G03F 7/702 (2013.01); G03F 7/7015 (2013.01); G03F 7/70058 (2013.01)

(58) Field of Classification Search
CPC ............ G03F 7/70075; G03F 7/70175; G03F 7/70083; G03F 7/70091; G03F 7/70108; G03F 7/70125; G03F 7/7015; G03F 7/70166; G03F 7/70183
USPC ......... 355/52, 53, 55, 67–71, 77; 250/492.1, 250/492.2, 492.22, 493.1, 503.1; 359/618, 619, 621–624, 627, 850, 359/857–859
See application file for complete search history.

(56) References Cited

U.S. PATENT DOCUMENTS

| | | | |
|---|---|---|---|
| 6,195,201 B1 | 2/2001 | Koch et al. | |
| 2003/0031017 A1 | 2/2003 | Tsuji | |
| 2006/0222041 A1 | 10/2006 | Moriwaka | |
| 2007/0132977 A1* | 6/2007 | Komatsuda | G02B 17/002 355/60 |
| 2007/0273859 A1 | 11/2007 | Komatsuda | |
| 2007/0296936 A1 | 12/2007 | Kato et al. | |
| 2008/0088813 A1 | 4/2008 | Takashima et al. | |
| 2008/0225387 A1 | 9/2008 | Hainz | |
| 2009/0051886 A1 | 2/2009 | Akiyama | |
| 2009/0213355 A1 | 8/2009 | Kajiyama | |
| 2010/0053584 A1 | 3/2010 | Kajiyama et al. | |
| 2010/0231880 A1 | 9/2010 | Kawabe | |

FOREIGN PATENT DOCUMENTS

| | | |
|---|---|---|
| JP | 2004-311814 | 11/2004 |
| JP | 2006-253487 | 9/2006 |
| JP | 2007-234717 | 9/2007 |
| JP | 2009-54340 | 3/2009 |
| KR | 10-2009-0013746 | 2/2009 |
| WO | WO 2007/138805 | 12/2007 |

OTHER PUBLICATIONS

Office Action issued by the Korean Patent Office dated Jul. 18, 2017 in corresponding Korean Patent application No. 10-2012-7028634.
International Search Report of PCT/JP2011/058189 dated Jul. 5, 2011.
Japanese Office Action dated Aug. 20, 2014 in corresponding Japanese Patent Application No. 2012-509567.
Notice of Allowance dated Mar. 2, 2017 in U.S. Appl. No. 13/639,037.
Advisory Action dated Feb. 22, 2016 in U.S. Appl. No. 13/639,037.
Office Action dated Sep. 9, 2016 in U.S. Appl. No. 13/639,037.
Office Action dated Nov. 25, 2015 in U.S. Appl. No. 13/639,037.
Office Action dated Jul. 15, 2015 in U.S. Appl. No. 13/639,037.
Restriction dated Apr. 20, 2015 in U.S. Appl. No. 13/639,037.
Korean Office Action dated Jan. 15, 2018 in corresponding Korean Patent Application No. 10-2017-7029894, 18 pgs.
Extended European Search Report dated Dec. 15, 2017, in corresponding European Patent Application No. 11765727.0, 9 pgs.
Notification of Reason for Refusal dated Feb. 15, 2019 issued in related Korean Patent Application No. 10-2019-7002269 (9 pages).

* cited by examiner

Dp

LIGHT SOURCE APPARATUS, OPTICAL APPARATUS, EXPOSURE APPARATUS, DEVICE MANUFACTURING METHOD, ILLUMINATING METHOD, EXPOSURE METHOD, AND METHOD FOR MANUFACTURING OPTICAL APPARATUS

CROSS-REFERENCE TO RELATED APPLICATIONS

This application is a continuation of U.S. application Ser. No. 13/639,037, filed on Dec. 17, 2012, which is a U.S. national phase entry of International Application No. PCT/JP2011/058189 which was filed on Mar. 31, 2011 claiming the conventional priority of U.S. Provisional Patent Applications No. 61/320,453, filed on Apr. 2, 2010 and No. 61/320,443, filed on Apr. 2, 2010 and the disclosure of U.S. Provisional Patent Applications No. 61/320,453 and No. 61/320,443 are incorporated herein by reference in their entirety.

BACKGROUND

1. Field

The present teaching relates to a light source apparatus, an optical apparatus, an exposure apparatus, a device producing method, an illumination method, an exposure method, and an optical apparatus producing method. More specifically, the present teaching relates to an illumination optical system of an exposure apparatus which is used to produce devices such as semiconductor elements, imaging elements, liquid crystal display devices, thin-film magnetic heads, etc., through a lithography process.

2. Description of the Related Art

Conventionally, in an exposure apparatus which is used to produce semiconductor elements, etc., a circuit pattern formed on a mask (reticle) is projected and transferred onto a photosensitive substrate (for example, a wafer) via a projection optical system. A resist coated on the photosensitive substrate is exposed through projection exposure via the projection optical system, and thus a pattern of the resist (resist pattern) corresponding to a pattern of the mask (mask pattern) is obtained. The resolving power (resolution) of the exposure apparatus depends on the wavelength of an exposure light (exposure light beam) and the numerical aperture of the projection optical system. Therefore, in order to improve the resolving power of the exposure apparatus, it is required to shorten the wavelength of the exposure light and to increase the numerical aperture of the projection optical system.

From the viewpoint of optical design, it is generally difficult to increase the numerical aperture of the projection optical system to a predetermined value or more. Therefore, it is necessary to shorten the wavelength of the exposure light. In view of this, attention is directed to an EUVL (Extreme UltraViolet Lithography) technique, which uses an EUV light (Extreme UltraViolet light or light beam) having a wavelength of approximately 5 nm to 20 nm, as a next-generation exposure technique (exposure apparatus) to be used for patterning semiconductor elements. In the case of using the EUV light as the exposure light, any usable light-transmissive optical material is not available. Therefore, the EUV exposure apparatus uses a reflection-type optical integrator, a reflection-type mask, and a reflection-type projection optical system.

For an ordinary exposure apparatus not limited to the EUV exposure apparatus, it is desirable to uniformize the light intensity distribution formed in a pupil of the illumination optical system (also referred to as "pupil intensity distribution" hereinbelow). The present applicant proposes a technique of forming an almost uniform pupil intensity distribution in an illumination pupil by elaborating the corresponding relation between a plurality of first mirror elements in a first fly's eye optical member and a plurality of second mirror elements in a second fly's eye optical member in the reflection-type optical integrator (see, United States Patent Application Publication No. 2007/0273859).

SUMMARY

In the illumination optical system disclosed in U.S. Patent Application Publication No. 2007/0273859, the respective light fluxes wavefront-divided by the plurality of first mirror elements in the first fly's eye optical member form, in a superposed manner, an illumination area as an image of the first mirror elements on a pattern surface of the mask which is the irradiation surface (surface to be irradiated), via the corresponding second mirror elements in the second fly's eye optical member. However, as will be described hereinafter, a distortion may arise from the relative disposition and the like between the first fly's eye optical member and the second fly's eye optical member, and therefore the image of the first mirror elements formed on the irradiation surface does not take a similar shape to the first mirror elements. As a result, the plurality of light fluxes wavefront-divided by the plurality of first mirror elements form the respective illuminating fields on the irradiation surface off the superposed illumination area of a desired profile (outer shape), and consequently a light loss arises from a so-called overlap error of the illuminating fields.

The present teaching has been made taking the foregoing problem into consideration, an object of which is to illuminate the irradiation surface under a required illumination condition capable of achieving a high light efficiency while keeping the light loss small.

According to a first aspect of the present teaching, there is provided an optical apparatus illuminating a first area with light from a light source, the first area being longer in a second direction intersecting a first direction than in the first direction, the optical apparatus including: a collector optical member which is arranged in an optical path between the light source and the first area, and condenses the light from the light source to form a second area in a predetermined plane, the second area being longer in a fourth direction intersecting a third direction than in the third direction; and a first fly's eye optical member which is provided within the predetermined plane including the second area, and has a plurality of first optical elements guiding the light from the collector optical member to the first area.

According to a second aspect of the present teaching, there is provided an optical apparatus used for illuminating a first area with light from a light source, the first area being longer in a second direction intersecting a first direction than in the first direction, the optical apparatus including: a first fly's eye optical member which is provided in an optical path between the light source and the first area, and which includes a plurality of first optical elements aligned in a predetermined plane, the plurality of first optical elements each having a profile longer in a fourth direction intersecting a third direction than in the third direction, the plurality of first optical elements forming an aggregate having length in the third direction and in the fourth direction which are different from each other; and a second fly's eye optical member which is provided in an optical path between the first fly's eye optical member and the first area, and has a plurality of second optical elements arranged to correspond optically to the first optical elements.

According to a third aspect of the present teaching, there is provided an optical apparatus used for illuminating a first area with light from a light source, the first area being longer in a second direction intersecting a first direction than in the first direction, the optical apparatus comprising: a first fly's eye optical member which is provided within a predetermined plane including a second area, and has a plurality of first optical elements, wherein at least one of the plurality of first optical elements has an optical surface, the optical surface having surface curvatures along a third direction and along a fourth direction intersecting the third direction, which are different from each other within the surface perpendicular to the second area.

According to a fourth aspect of the present teaching, there is provided an exposure apparatus including the optical apparatus according to the first aspect, the second aspect, or the third aspect for illuminating a predetermined pattern formed in the first area, wherein a photosensitive substrate is exposed with the predetermined pattern.

According to a fifth aspect of the present teaching, there is provided a device producing method including the steps of: exposing the photosensitive substrate with the predetermined pattern by using the exposure apparatus according to the fourth aspect; developing the photosensitive substrate to which the predetermined pattern has been transferred to form, on a surface of the photosensitive substrate, a mask layer shaped to correspond to the predetermined pattern; and processing the surface of the photosensitive substrate via the mask layer.

According to a sixth aspect of the present teaching, there is provided a light source apparatus supplying light to a fly's eye optical member provided within a predetermined plane, the apparatus including: a light-emitting portion emitting the light; and a collector optical member condensing the light emitted by the light-emitting portion to form, in the predetermined plane, a second area longer in a fourth direction intersecting a third direction than in the third direction.

According to a seventh aspect of the present teaching, there is provided an illumination method for illuminating a first area with light from a light source, the first area being longer in a second direction intersecting a first direction than in the first direction, the method including the steps of: condensing the light from the light source and guiding the light to a second area on a predetermined plane; wavefront-dividing the light into a plurality of light fluxes having a profile longer in a fourth direction intersecting a third direction than in the third direction on the predetermined plane; and guiding the plurality of wavefront-divided light fluxes to the first area, wherein the second area has a shape longer in the fourth direction than in the third direction; and the plurality of light fluxes on the predetermined plane are aligned in a plurality of rows along the third direction and along the fourth direction.

According to an eighth aspect of the present teaching, there is provided an exposure method including the steps of: illuminating the first area in a predetermined pattern by using the illumination method according to the seventh aspect; and exposing a photosensitive substrate with the predetermined pattern.

According to a ninth aspect of the present teaching, there is provided a device producing method including the steps of: exposing the photosensitive substrate with the predetermined pattern by using the exposure method according to the eighth aspect; developing the photosensitive substrate to which the predetermined pattern has been transferred to form, on a surface of the photosensitive substrate, a mask layer shaped to correspond to the predetermined pattern; and processing the surface of the photosensitive substrate via the mask layer.

According to a tenth aspect of the present teaching, there is provided an optical apparatus producing method used for illuminating a first area with light from a light source, the first area being longer in a second direction intersecting a first direction than in the first direction, the method including the steps of: obtaining a collector optical member condensing the light from the light source to form a second area in a predetermined plane, the second area being longer in a fourth direction intersecting a third direction than in the third direction; and arranging a first fly's eye optical member having a plurality of first optical elements within the predetermined plane including the second area.

According to an eleventh aspect of the present teaching, there is provided an optical apparatus producing method used for illuminating a first area with light from a light source, the first area being longer in a second direction intersecting a first direction than in the first direction, the method including the steps of: preparing a plurality of first optical elements having a profile longer in a fourth direction intersecting a third direction than in the third direction; and obtaining a first fly's eye optical member which includes an aggregate of the plurality of first optical elements aligned in the third direction and the fourth direction ,the aggregate having different lengths from each other in the third direction and in the fourth direction.

According to the embodiments as described above, it is possible to illuminate the irradiation surface under a required illumination condition capable of achieving a high light efficiency while keeping the occurrence of light loss at a low level. As a result, it is possible to achieve a high throughput.

FIG. 1 schematically shows a construction of an exposure apparatus according to an embodiment of the present teaching;

FIG. 2 is a diagram for schematically explaining one time of scanning exposure according to the embodiment;

FIG. 3 schematically shows a construction of a first fly's eye optical member in an optical integrator;

FIG. 4 schematically shows a construction of a second fly's eye optical member in the optical integrator;

Figure 1:
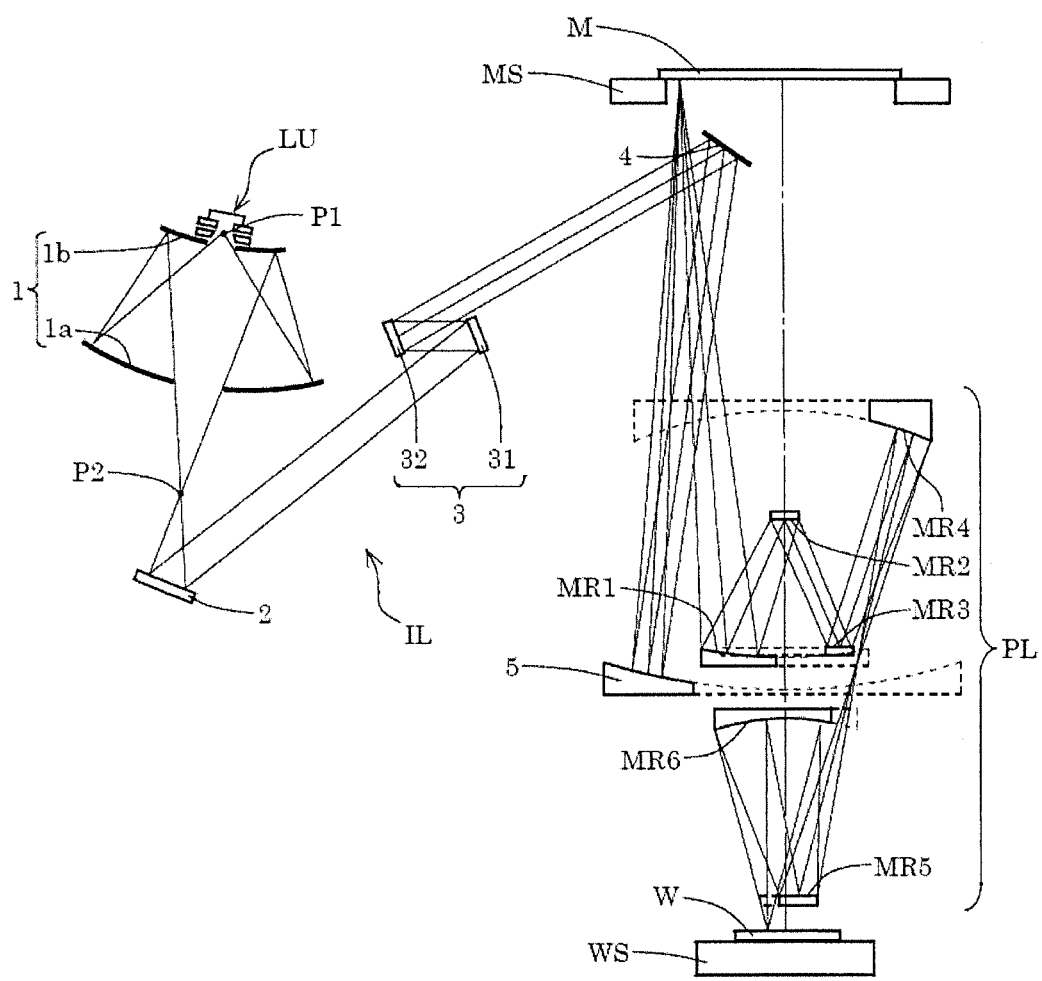
Figure 1:
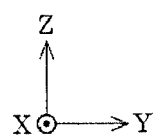
Figure 7:
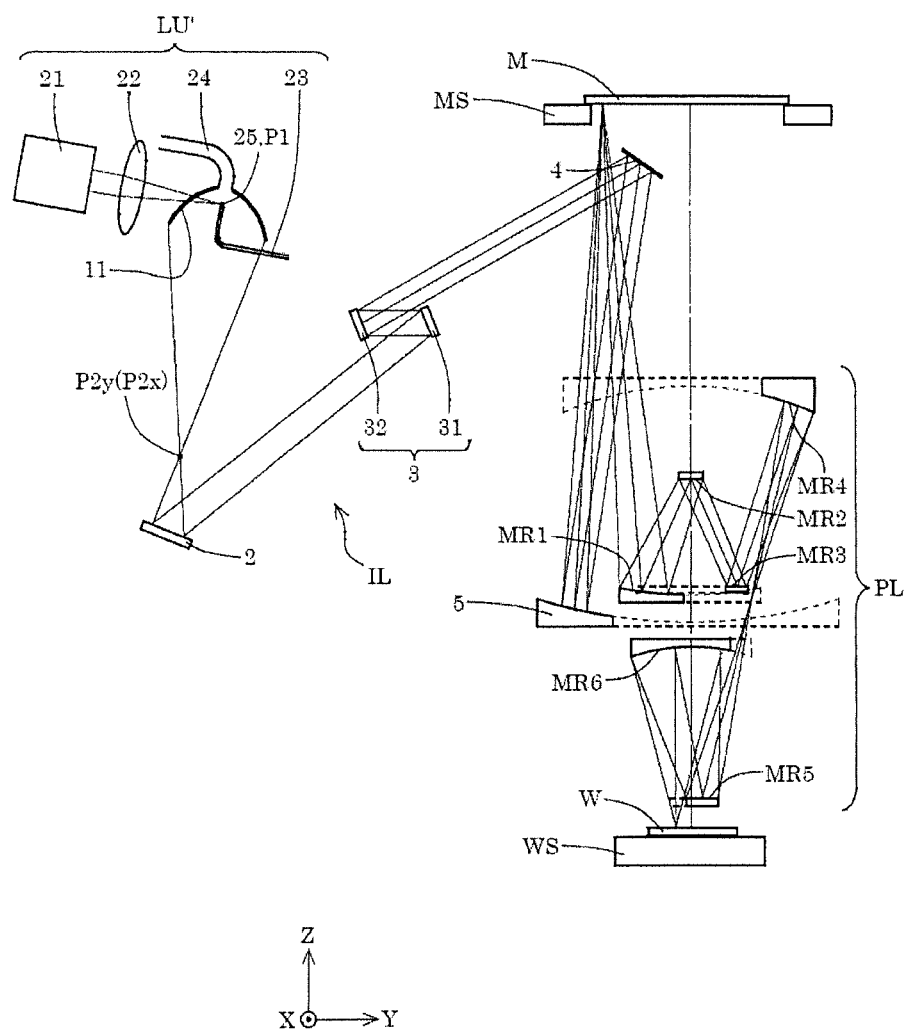
Figure 8:
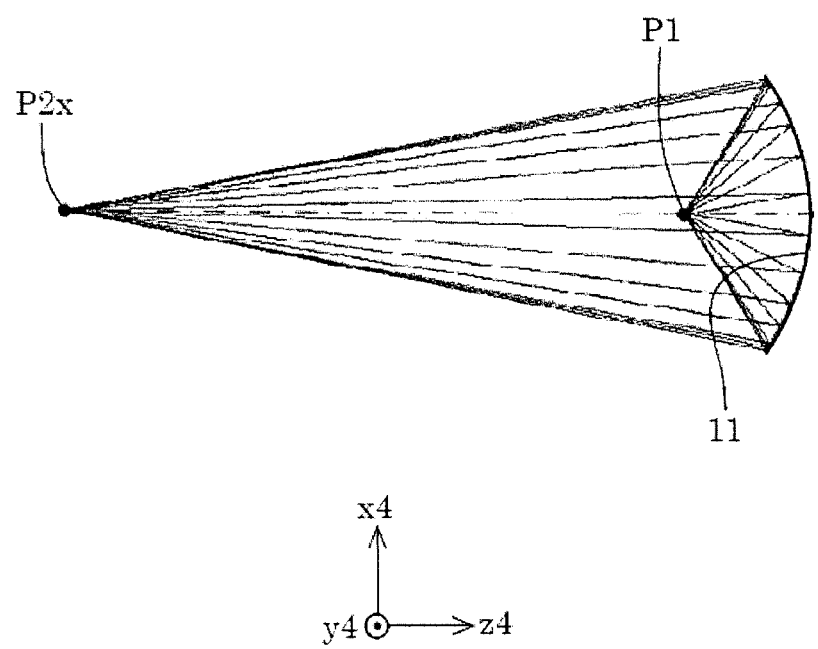
Figure 9:
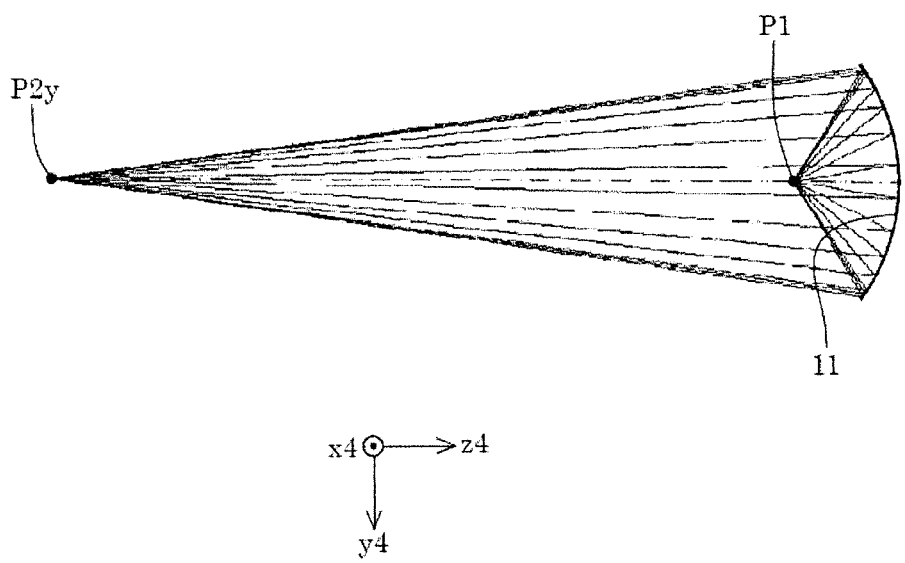
Figure 10:
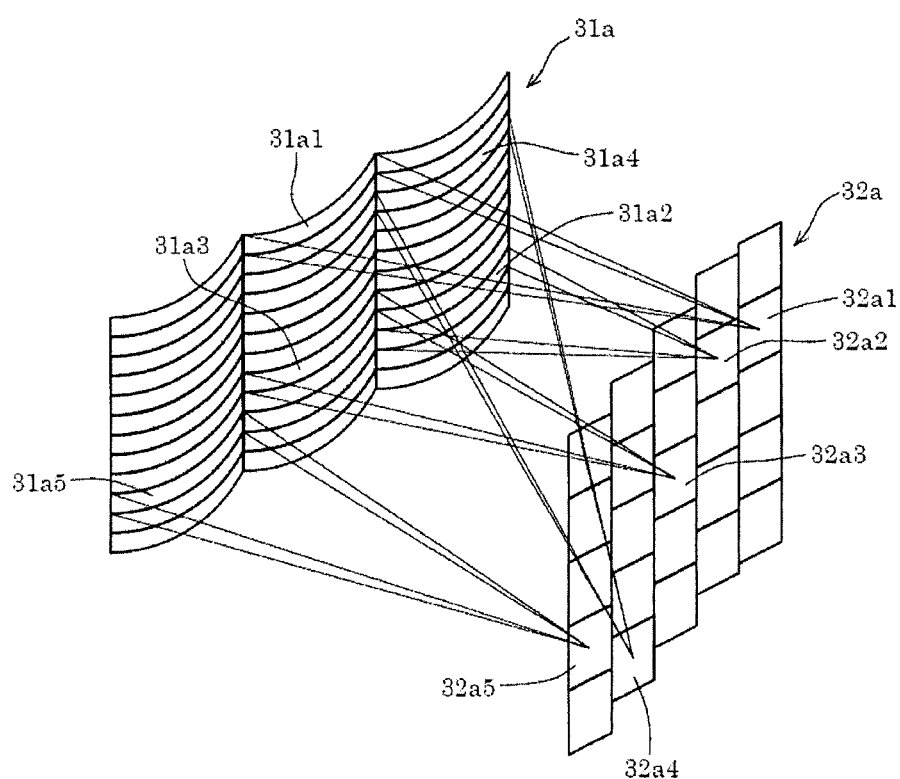
Figure 11:
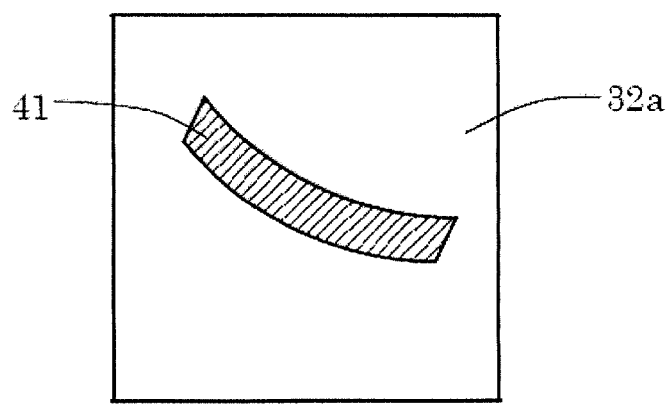
Figure 12:
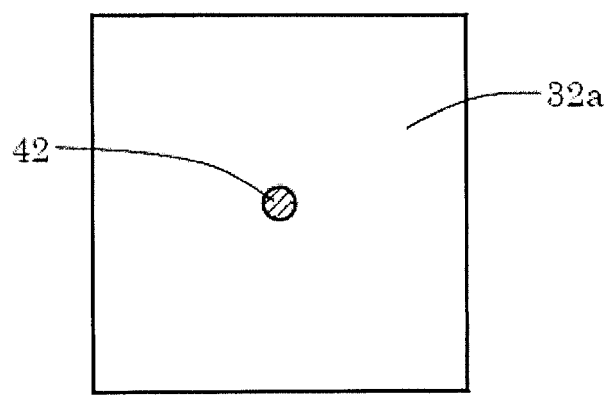
Figure 13:
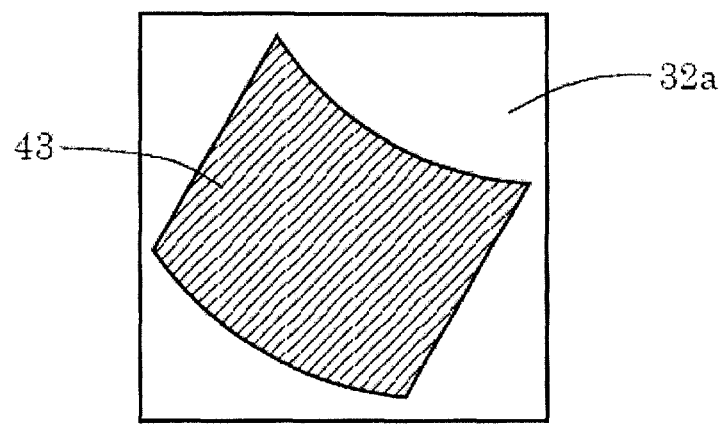
Figure 14:
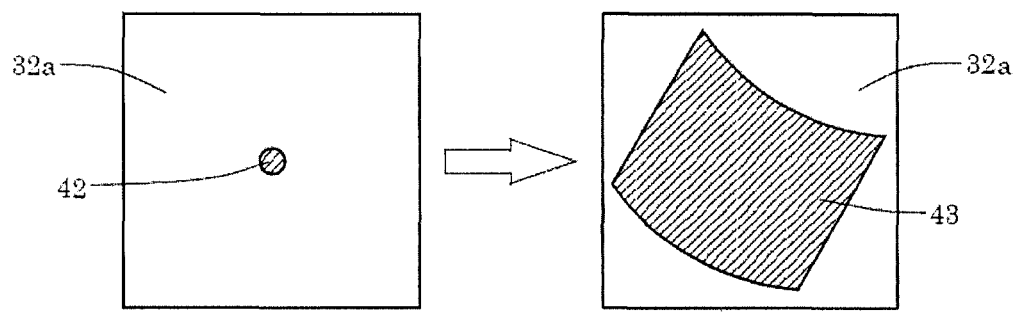
Figure 15:
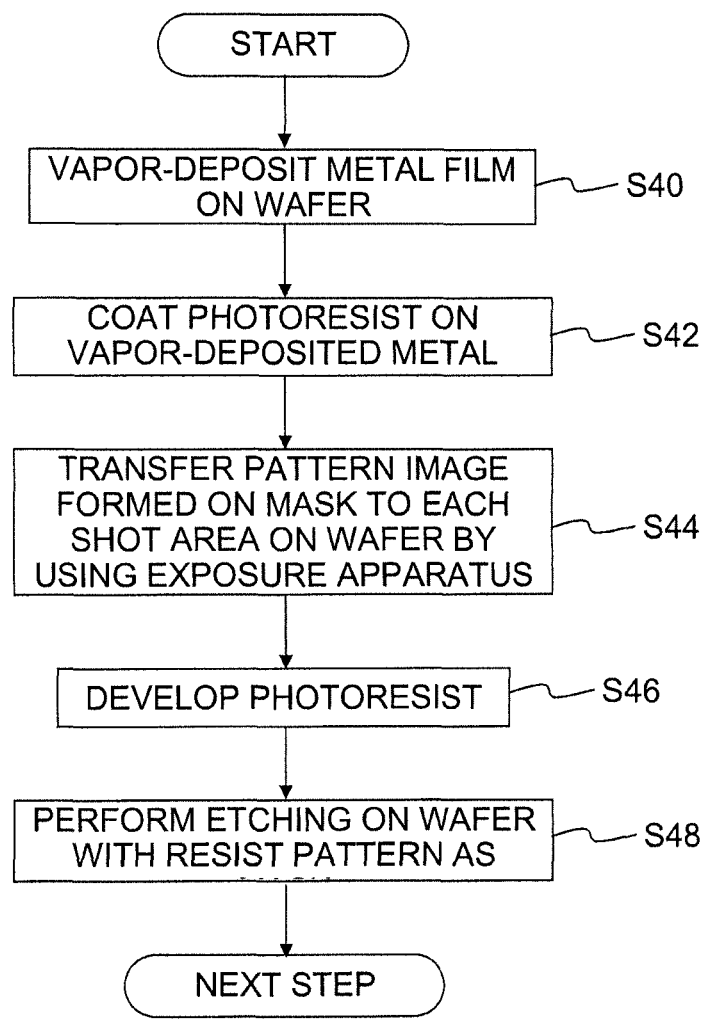

FIG. 7 schematically shows a construction of an exposure apparatus according to a first modification;

FIG. 8 is a first diagram schematically showing a construction of a collector optical member according to the first modification;

FIG. 9 is a second diagram schematically showing the construction of the collector optical member according to the first modification;

FIG. 10 shows an aspect of an optically corresponding relation between first mirror elements and second mirror elements;

FIG. 11 shows an aspect of forming a light source image elongated in one direction in one of the second mirror elements in the first modification shown in FIG. 7;

FIG. 12 schematically shows an example of a light source image formed in one of the second mirror elements by forming toroidal reflecting surfaces of the first mirror elements in a second modification;

FIG. 13 schematically shows another example of the light source image formed in the second mirror element by forming the toroidal reflecting surfaces of the first mirror elements in the second modification;

FIG. 14 shows an effect obtained by applying the technique of the second modification to the construction of the embodiment shown in FIG. 1; and FIG. 15 shows a flowchart concerning an exemplary technique adopted when a semiconductor device is obtained as a microdevice by way of example.

DESCRIPTION OF THE EMBODIMENTS

Hereinbelow, an embodiment will be explained based on the accompanying drawings. FIG. 1 schematically shows a construction of an exposure apparatus according to the embodiment of the present invention. In FIG. 1, the Z axis is defined along the normal direction of a surface (exposure surface) of a wafer W which is a photosensitive substrate, the Y axis is defined in the direction parallel to the sheet surface of FIG. 1 in the surface of the wafer W, and the X axis is defined in the direction perpendicular to the sheet surface of FIG. 1 in the surface of the wafer W, respectively. Referring to FIG. 1, in the exposure apparatus of the embodiment, exposure light (illumination light) is supplied from a light source apparatus including a light source unit LU of DPP (Discharge Produced Plasma) type, and a collector optical member 1.

In the light source unit LU of DPP type, when a voltage is applied to the electrodes made of a target substance (material), or to the electrodes between which the target material is present, then discharge will occur between the electrodes at the point of time when the voltage exceeds a certain value, thereby turning the target material into plasma. This discharge causes a large (electric) current to flow between the electrodes. Thus, the plasma compresses itself into a miniature space due to the magnetic field produced by this current, thereby raising the plasma temperature. From this high-temperature plasma, EUV light is emitted. A light source supplying (exciting) energy to the plasma through discharge to emit the EUV light, in this manner, is generally called a DPP light source.

The EUV light emitted from the light source unit LU comes into a collimator optical member 2 via the collector optical member 1. The collector optical member 1 includes a concave-surface reflecting mirror 1a with a through hole formed in the center, and a convex-surface reflecting mirror 1b with a through hole formed likewise in the center, according to the order of the incidence of the light from the light source unit LU. The concave-surface reflecting mirror 1a as a first reflecting mirror has a reflecting surface shaped into a concave surface toward the light source unit LU, while the convex-surface reflecting mirror 1b as a second reflecting mirror has a reflecting surface shaped into a convex surface toward the concave-surface reflecting mirror 1a.

The divergent light emitted from a light-emitting point P1 of the light source unit LU comes into the concave-surface reflecting mirror 1a via the through hole of the convex-surface reflecting mirror 1b. The light reflected by the reflecting surface of the concave-surface reflecting mirror 1a is focused or condensed at a point P2 via the through hole of the concave-surface reflecting mirror 1a after being reflected by the reflecting surface of the convex-surface reflecting mirror 1b. That is, the collector optical member 1 reflects and condenses the light from the light source unit LU to form a primary image of the light source at the position of the point P2. The EUV light once condensed at the point P2 passes through a pinhole member (not shown) arranged in the vicinity of the point P2, and then becomes an approximately parallel light flux via the collimator optical member 2 having the form of a concave-surface reflecting mirror, so as to be shaped in a second area of a predetermined plane. The EUV light shaped in the second area enters or comes into a fly's eye optical member 31 from the incident surface of the fly's eye optical member 31 provided on the predetermined plane, and is guided to an optical integrator 3 composed of a pair of fly's eye optical members 31 and 32. The construction and function of the fly's eye optical members 31 and 32 will be described hereinafter.

A substantial surface light source (pupil intensity distribution) having a predetermined shape is formed in the vicinity of the light exit surface of the optical integrator 3, i.e. at a position near the reflecting surface of the second fly's eye optical member 32 (the position of the illumination pupil). The light from this substantial surface light source travels via a deflecting member 4 having a planar reflecting surface, and a condenser optical system 5 having the form of a concave-surface reflecting mirror and then exits from an illumination optical system IL (from 1 to 5). The position of the illumination pupil of the illumination optical system IL with the substantial surface light source formed as described above is the position of the entrance pupil of a below-described projection optical system PL, or the position optically conjugate to the entrance pupil of the projection optical system PL.

The light exiting from the illumination optical system IL forms a circular-arc-shaped superposed illumination area (a first area) on the pattern surface of a mask M via a circular-arc-shaped opening (light transmission portion) of a field stop (not shown) arranged to be approximately parallel and adjacent to the reflection-type mask (reticle) M. As a pattern to be transferred, for example a circuit pattern for use in a device is formed on the mask M. The illumination optical system IL forms a pupil intensity distribution provided by the substantial surface light source in the illumination pupil with the light from the light source unit LU, and performs Köhler illumination on the pattern on the mask M with the light from this pupil intensity distribution.

The mask M is held by a mask stage MS movable along the Y direction such that the pastern surface may extend along the X-Y plane. The movement of the mask stage MS is measured by a laser interferometer (not shown) having a known construction. The light from the illuminated pattern of the mask M forms a mask pattern image on the wafer W as a photosensitive substrate via the reflection-type projection optical system PL. That is, as will be described hereinafter, on the wafer W, there is formed a stationary exposure area (effective exposure area) having a shape of, for example, a circular arc symmetric about the Y axis.

The projection optical system PL is constructed of, as an example, a first reflective imaging optical system forming an intermediate image of the pattern of the mask M, and a second reflective imaging optical system forming, on the wafer W, an image of the intermediate image of the mask pattern (a secondary image of the pattern of the mask M). The first reflective imaging optical system is constructed of four reflecting mirrors MR1 to MR4, and the second reflective imaging optical system is constructed of two reflecting mirrors MR5 and MR6. Further, the projection optical system PL is an optical system telecentric on the wafer side (image side).

The wafer W is held by a wafer stage WS two-dimensionally movable along the X direction and the Y direction such that the exposure surface may extend along the X-Y plane. The movement of the wafer stage WS is measured by a laser interferometer (not shown) having a known construction. In this manner, by carrying out a scanning exposure while moving the mask stage MS and the wafer stage WS along the Y direction, i.e. moving the mask M and the wafer W relative to the projection optical system PL along the Y direction, the pattern of the mask M is transferred to one rectangular shot area of the wafer W.

At this time, provided the projection magnification (transfer magnification) of the projection optical system PL is ¼, for example, then the movement speed of the wafer stage WS is set to be ¼ of the movement speed of the mask stage MS so as to carry out a synchronous scanning. Further, by repeating the scanning exposure while performing a two-dimensional step movement of the wafer stage WS along the X direction and the Y direction, the pattern of the mask M is sequentially transferred to each shot area of the wafer W. Further, while the mask is moved in the Y direction in the above explanation, the mask may alternatively be moved in an oblique direction to the Y direction (oblique running).

Figure 2:
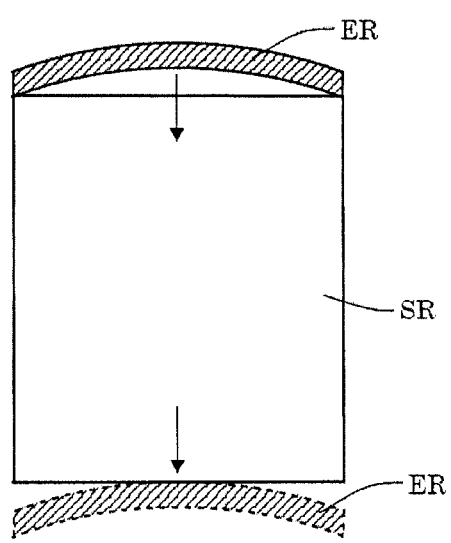

FIG. 2 is a diagram for schematically explaining one time of the scanning exposure according to the embodiment. Referring to FIG. 2, in the exposure apparatus of the embodiment, a circular-arc-shaped stationary exposure area ER symmetric about the Y axis is formed on the surface of the wafer W, and the circular-arc-shaped first area symmetric about the Y axis is formed on the pattern surface of the mask M, so as to correspond to the circular-arc-shaped effective imaging area and effective illumination area of the projection optical system PL. In other words, the Y direction corresponds to the normal direction of the circular arc sides through the center of the circular arc profile (outer shape) of the first area and the stationary exposure area ER, while the X direction corresponds to the perpendicular direction to the Y direction. When transferring the pattern of the mask M to one rectangular shot area SR of the wafer W by one time of the scanning exposure, the circular-arc-shaped exposure area ER moves from a scan-starting position shown by the solid line in the figure down to a scan-ending position shown by the broken line in the figure.

Figure 3:
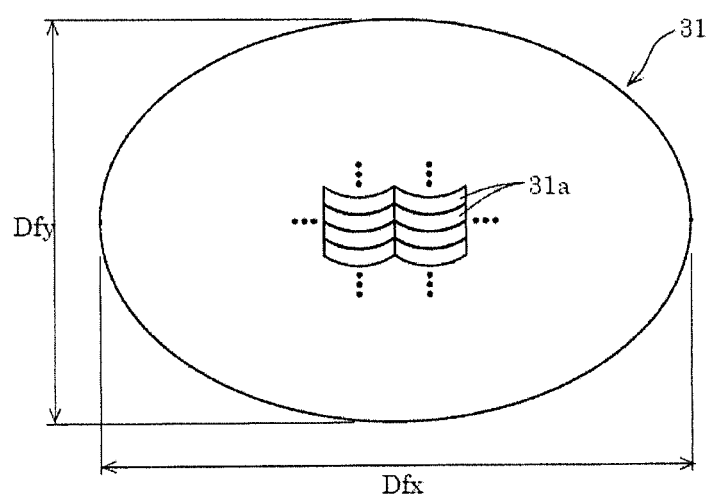
Figure 4:
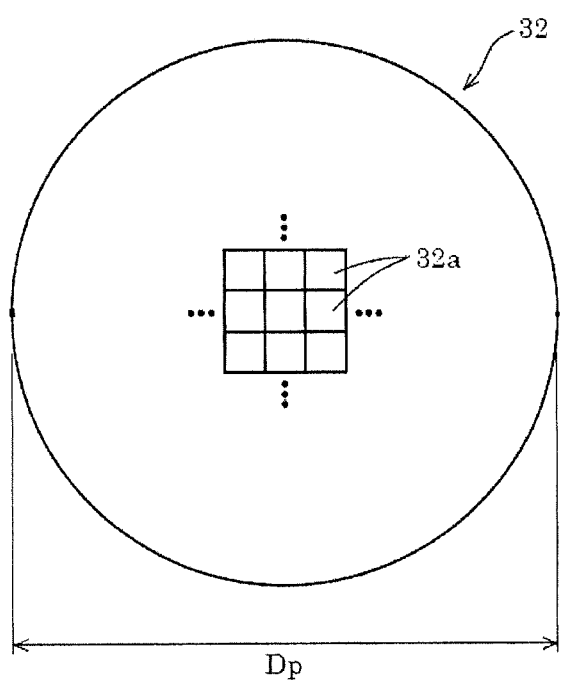
Figure 4:
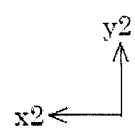

In the optical integrator 3, the first fly's eye optical member 31 includes a plurality of first mirror elements (first optical elements) 31a as shown in FIG. 3. The plurality of first mirror elements 31a each have the form of a concave-surface reflecting mirror, and are arranged in parallel arrays on a predetermined plane in the position optically conjugate to the pattern surface of the mask M, i.e. the irradiation surface of the illumination optical system IL. The second fly's eye optical member 32 includes a plurality of second mirror elements 32a (second optical elements) as shown in FIG. 4. The plurality of second mirror elements 32a each have the form of a concave-surface reflecting mirror, and are arranged in parallel arrays to correspond optically to the plurality of first mirror elements 31a in an one-to-one manner.

In FIG. 3, in an incident surface of the first fly's eye optical member 31, an x1 direction is defined as a direction corresponding to the X direction, and a y1 direction is defined as the perpendicular direction to the x1 direction in the incident surface. Further, the incident surface of the first fly's eye optical member 31 refers to an area occupied by the reflecting surfaces of the plurality of first mirror elements 31a within the predetermined plane. Likewise, in FIG. 4, in an incident surface of the second fly's eye optical member 32, an x2 direction is defined as a direction corresponding to the X direction, and a y2 direction is defined as the perpendicular direction to the x2 direction in the incident surface. Further, the incident surface of the second fly's eye optical member 32 refers to an area occupied by the reflecting surfaces of the plurality of second mirror elements 32a within the predetermined plane. That is, the y1 and y2 directions in FIGS. 3 and 4 correspond to the scanning direction (the Y direction) of the mask M and the wafer W. For the purpose of clarifying the drawings, FIGS. 3 and 4 show only some of the many mirror elements 31a and 32a constituting the pair of fly's eye optical members 31 and 32.

As shown in FIG. 3, the first fly's eye optical member 31 is constructed by arranging the first mirror elements 31a having a circular arc profile (outer shape) in a matrix. That is, the first mirror elements 31a are arranged to align in the y1 direction such that the circular arc sides lie next to each other, and to align in the x1 direction such that the two circular arc ends lie next to each other. As described above, the first mirror elements 31a each have the circular arc profile for the purpose of forming the first area having a circular arc profile on the mask M and, furthermore, forming the circular-arc-shaped stationary exposure area ER on the wafer W, to correspond to the circular-arc-shaped effective imaging area and effective illumination area of the projection optical system PL.

When illuminating the first area having a circular arc profile, an optical element having a circular arc profile can be adopted as an optical element having the profile corresponding to the first area. For example, the profile of at least one optical element is similar to the profile of the first area in shape, but different from the profile of the first area in posture, curvature, aspect ratio between the X direction and the Y direction, and the like. Further, the first area and optical element are not limited to a circular arc profile. When illuminating the first area having a rectangular profile, an optical element having a rectangular profile can be adopted as an optical element having the profile corresponding to the first area. At this time, the profile of the optical element is similar to the profile of the first area in shape, but different from the profile of the first area in posture, curvature, aspect ratio between the X direction and the Y direction, and the like. Further, the profile of the first area may differ from the profile of the optical element. For example, the optical element may have a rectangular profile, and be configured such that the illumination light reflected by the optical element forms the first area having a circular arc profile by an optical system provided between the optical element and the first area. In addition, it is also possible to illuminate the first area in various shapes and use an optical element having a profile corresponding to the various shapes of the first area.

On the other hand, as shown in FIG. 4, the second fly's eye optical member 32 is constructed by arranging the second mirror elements 32a having, for example, a near-square rectangular profile in a matrix. That is, the second mirror elements 32a are arranged to align in the x2 direction and the y2 direction such that the rectangular sides lie next to each other. The second mirror elements 32a each have the near-square rectangular profile for the purpose of forming a small light source shaped into an approximate circle at or in the vicinity of the surface of each second mirror element 32a. Further, the profile of the second mirror elements 32a is not limited to the shape of square or rectangle, but may be a shape of polygon other than tetragon (i.e., from triangle to octagon, and the like). Further, in order to minimize the light loss, a shape allowing for tight arrangement is preferable (allowing the optical elements to be arranged without space therebetween).

The envelope curve of the aggregate of the respective first mirror elements 31a of the first fly's eye optical member 31 is elliptical for the purpose of improving the illumination efficiency because, as will be described hereinafter, the cross-section shape of the incoming light flux to the optical integrator 3 (i.e. the incident light flux on the first fly's eye optical member 31) is elliptical. Further, the envelope curve of the aggregate of every second mirror element 32a of the second fly's eye optical member 32 is approximately circular because of the approximately circular profile of the pupil intensity distribution (the substantial surface light source) formed in the illumination pupil in the vicinity of the light exit surface of the optical integrator 3 (i.e. the light exit surface of the second fly's eye optical member 32).

Further, the envelope curve of the aggregate of the first mirror elements 31a is not limited to the shape of ellipse, but may take any shape which is longer in the x1 direction than in the y1 direction. The first mirror elements 31a may be arranged to draw the envelope curve in various shapes such as rectangle, polygon, oval, and the like. Further, the envelope curve of the aggregate of the second mirror elements 32a is not limited to the shape of approximate circle, and the second mirror elements 32a may be arranged to draw the envelope curve in various shapes such as true circle, ellipse, oval, rectangle, polygon, and the like.

In the embodiment, the incoming light flux to the optical integrator 3 is wavefront-divided by the plurality of first mirror elements 31a in the first fly's eye optical member 31. The light fluxes reflected by the respective first mirror elements 31a comes into the corresponding second mirror elements 32a in the second fly's eye optical member 32. The light fluxes reflected by the respective second mirror elements 32a illuminate the circular-arc-shaped first area on the mask M in a superposed manner via the deflecting member 4 and condenser optical system 5 as a light guiding optical system.

Prior to explaining the characteristic construction and function of the embodiment, some problems in the conventional art will be described below. Referring to FIG. 1, the light from the light source unit LU is guided to the mask M after being folded at the first fly's eye optical member 31 and the second fly's eye optical member 32. In order that the incoming light to the first fly's eye optical member 31 might not be blocked by the second fly's eye optical member 32, and the outgoing light from the second fly's eye optical member 32 might not be blocked by the first fly's eye optical member 31, it is not possible to make the light incident vertically by placing the first fly's eye optical member 31 and second fly's eye optical member 32 face-to-face or head-on, but it is necessary to make the light incident obliquely by laterally shifting the first fly's eye optical member 31 and second fly's eye optical member 32 to some extent along the sheet surface of FIG. 1.

In this case, the second mirror elements 32a constituting the second fly's eye optical member 32 see the first mirror elements 31a constituting the first fly's eye optical member 31 in an oblique direction (a direction oblique to or inclined with respect to the normal direction of the incident surface of the second fly's eye optical member 32). To express it in another way, the first mirror elements 31a look distorted as viewed from the second mirror elements 32a. Therefore, although the plurality of second mirror elements 32a project the respectively corresponding first mirror elements 31a onto the irradiated pattern surface of the mask M as the irradiation surface, due to the effect of seeing the first mirror elements 31a from this oblique direction, the images of the first mirror elements 31a projected onto the mask M cannot be correctly similar in shape to the first mirror elements 31a.

In other words, a distortion arises from the relative disposition and the like between the first fly's eye optical member 31 and the second fly's eye optical member 32. As a result, the plurality of light fluxes wavefront-divided by the plurality of first mirror elements 31a form every circular-arc-shaped illuminating field on the pattern surface of the mask M off the desired circular-arc-shaped first area, and consequently a light loss arises from a so-called overlap error of the illuminating fields.

Next, the characteristic construction of the embodiment of the present teaching will be explained. The optical integrator 3 is an optical element which uniformizes the illuminance distribution in the first area by wavefront-dividing a light flux into a plurality of light fluxes and, superposing these plurality of light fluxes on the irradiation surface (such as the pattern surface of the mask M and, furthermore, the exposure surface of the wafer W). Therefore, the optical integrator 3 can have a necessary number of optical elements (such as the mirror elements 31a and 32a) for the uniformization. Further, because the uniformization is comparatively independent between the vertical direction (such as the y1 direction and y2 direction), and the horizontal direction (such as the x1 direction and x2 direction), it is also possible to have a certain number or more of rows of optical elements both in the horizontal direction and in the vertical direction.

Here, suppose that the number of rows of the first mirror elements 31a in the first fly's eye optical member 31 is n in the x1 direction. Further, suppose that the envelope curve of the aggregate of respective first mirror elements 31a of the first fly's eye optical member 31 is circular, and its diameter is Df. In this case, the dimension of the mirror elements 31a is Df/n in the x1 direction. As the number of rows n in the x1 direction is greater, it is more preferable for the uniformization, and the number may be five or more.

Suppose that the interval between the first fly's eye optical member 31 and the second fly's eye optical member 32 is Ff; the envelope curve of the aggregate of respective second mirror elements 32a of the second fly's eye optical member 32 is circular, and its diameter is Dp. Suppose that the focal distance of the light guiding optical system interposed between the second fly's eye optical member 32 and the mask M, i.e., the focal distance of the condenser optical system 5, is Fc. Further, in case of the construction without interposing an optical system having power between the second fly's eye optical member 32 and the mask M, it is possible to consider that the distance from the second fly's eye optical member 32 to the mask M is Fc.

Provided that the dimension of the circular-arc-shaped first area to be formed on the mask M is Wi along the X direction, and provided that the numerical aperture required for the incident light fluxes on the mask M is NAi, then the relations shown in the following formulas (1) and (2) hold. Further, although it is necessary to add production error and the like in the optical elements, the influence of the production error and the like in the optical elements is ignored here for simplifying the explanation.

$$Wi \approx (Df/n) \times (Fc/Ff) \quad (1)$$

$$NAi \approx Dp/(2 \times Fc) \quad (2)$$

The formula (1) corresponds to the fact that each of the mirror elements 31a of the first fly's eye optical member 31 is optically conjugate with the pattern surface of the mask M, and its imaging magnification is Fc/Ff. The formula (2) corresponds to the fact that each of the mirror elements 32a of the second fly's eye optical member 32 performs the function of an aperture stop. Now, "Setting a wide interval for the sum of the diameters" is none other than setting a small value of the right-hand term I in the following formula (3).

$$(Df+Dp)/Ff=I \qquad (3)$$

Hereinbelow, observation will be made with respect to the restriction on the value of the right-hand term I of the formula (3) by the formulas (1) and (2). The specifications of the exposure apparatus determine the dimension Wi of the circular-arc-shaped first area along the X direction, and the numerical aperture NAi of the incident light flux on the mask M. From the standpoint of designing the illumination optical system IL, the Wi and NAi are constants. Thus, the formulas (1) and (2) are modified as shown in the following formulas (4) and (5). Further, by substituting the formulas (4) and (5) into the formula (3), a relation shown in the following formula (6) is obtained.

$$Df \approx Wi \times n \times (Ff/Fc) \qquad (4)$$

$$Dp \approx NAi \times (2 \times Fc) \qquad (5)$$

$$I \approx Wi \times n/Fc + 2 \times NAi \times (Fc/Ff) \qquad (6)$$

Referring to the formula (6), it is obvious how to reduce the value of the left-hand term I. First, it is reasonable to reduce the number of rows n of the mirror elements 31a of the first fly's eye optical member 31 in the x1 direction. As described above, however, the number of rows n is a variant which cannot be reduced but should rather be expected to be increased for a sufficient uniformization of the illuminance distribution from the standpoint of optical design. As described above, the Wi and NAi are treated as constants. The other variants left on the right-hand side of the formula (6) are only the interval Ff between the pair of fly's eye optical members 31 and 32, and the focal distance Fc of the condenser optical system 5.

In this case, the only way to reduce the value of I is to set a large focal distance Fc of the condenser optical system 5 and, at the same time, set a wide interval Ff according to a larger enlargement rate than that of the focal distance Fc. However, as is apparent by reference to the formula (4), if a wide interval Ff is set according to a larger enlargement rate than that of the focal distance Fc, then the diameter Df of the first fly's eye optical member 31 becomes larger. Further, as is apparent by reference to the formula (5), if a large focal distance Fc is set, then the diameter Dp of the second fly's eye optical member 32 becomes larger.

As a result, the size of the optical integrator 3 becomes large, and consequently the size of the illumination optical system IL becomes large unavoidably. Further, in order to improve the resolving power of EUV exposure apparatuses, it is considered recently to set an even larger numerical aperture NAi of the incident light flux on the mask M. As is apparent by reference to the formula (6), if the numerical aperture NAi becomes even larger, then the value of the left-hand term I also becomes larger, thereby causing the size of the optical integrator 3 to become further larger.

In the embodiment, as shown in FIG. 3, the envelope curve of the aggregate of every first mirror element 31a of the first fly's eye optical member 31 is set to be an ellipse with the major axis Dfx in the x1 direction and the minor axis Dfy in the y1 direction. In this case, the above formulas (1), (3) and (4) can be rewritten as shown in the following formulas (1A), (3A) and (4A).

$$Wi \approx (Dfx/n) \times (Fc/Ff) \qquad (1A)$$

$$(Dfy+Dp)/Ff=I \qquad (3A)$$

$$Dfx \approx Wi \times n \times (Ff/Fc) \qquad (4A)$$

Accordingly, provided the major axis Dfx is m times the minor axis Dfy (m>1), the relationship between Dfx and Dfy is expressed as Dfx=m×Dfy, then the above formula (6) can be rewritten as shown in the following formula (6A). Comparing the formula (6) with the formula (6A), the value of the first right-hand term of the formula (6A) is 1/m (1/m<1) times the value of the first right-hand term of the formula (6). Thus, it is understood that the value of I becomes smaller by the difference between these terms.

$$I \approx (Wi \times n/Fc)/m + 2 \times NAi \times (Fc/Ff) \qquad (6A)$$

Conventionally, the envelope curve of the aggregate of the respective first mirror elements 31a of the first fly's eye optical member 31 is approximately circular because the divergent light supplied from the light source has a constant spread angle independent of direction and a circular cross section and, furthermore, the incident light flux on the first fly's eye optical member 31 also has a circular cross section. In the embodiment, by setting the envelope curve of the aggregate of the respective first mirror elements 31a of the first fly's eye optical member 31 to be elongated in the x1 direction, it is possible to reduce the value of the left-hand term I of the formula (6A) without causing the fly's eye optical members 31 and 32 to grow in size. At this time, the envelope curve of the aggregate of the first mirror elements 31a may have an elliptical shape elongated in the x1 direction.

Further, if the light flux having a cross-sectional shape elongated in the x1 direction comes into the first fly's eye optical member 31, then it is possible to maintain a high illumination efficiency at the first fly's eye optical member 31. At this time, the collector optical member 1 may be constructed to convert the light flux being emitted from the light-emitting point P1 of the light source unit LU and having a circular cross section, i.e., the light flux having a constant spread angle independent of direction, into a light flux having a cross section elongated in the x1 direction, and then cause the converted light flux to come into the first fly's eye optical member 31. At this time, the cross section of the incident light flux on the first fly's eye optical member 31 from the collector optical member 1 can have an elliptical shape elongated in the x1 direction.

In this manner, in the illumination optical system IL of the embodiment, it is possible to restrain distortion from occurring without causing the optical integrator 3 to grow in size and, furthermore, to illuminate the mask M under a required illumination condition capable of achieving a high light efficiency while keeping the occurrence of light loss due to the overlap error of illuminating fields at a low level. As a result, in the exposure apparatus of the embodiment, it is possible to carry out a favorable exposure under a favorable illumination condition by using the illumination optical system IL illuminating the mask M under a required illumination condition capable of achieving a high light efficiency while keeping the light loss small.

That is, in the embodiment, it is possible to restrain distortion from occurring without causing the optical integrator 3 to grow in size and, furthermore, to keep the occurrence of light loss due to the overlap error of illuminating fields at a low level. As a result, in the exposure apparatus of the embodiment, it is possible to carry out a favorable exposure under a favorable illumination condition by using the illumination optical system IL provided with the optical integrator 3 keeping the light loss small to illuminate the mask M under a required illumination condition capable of achieving a high light efficiency.

Figure 5:
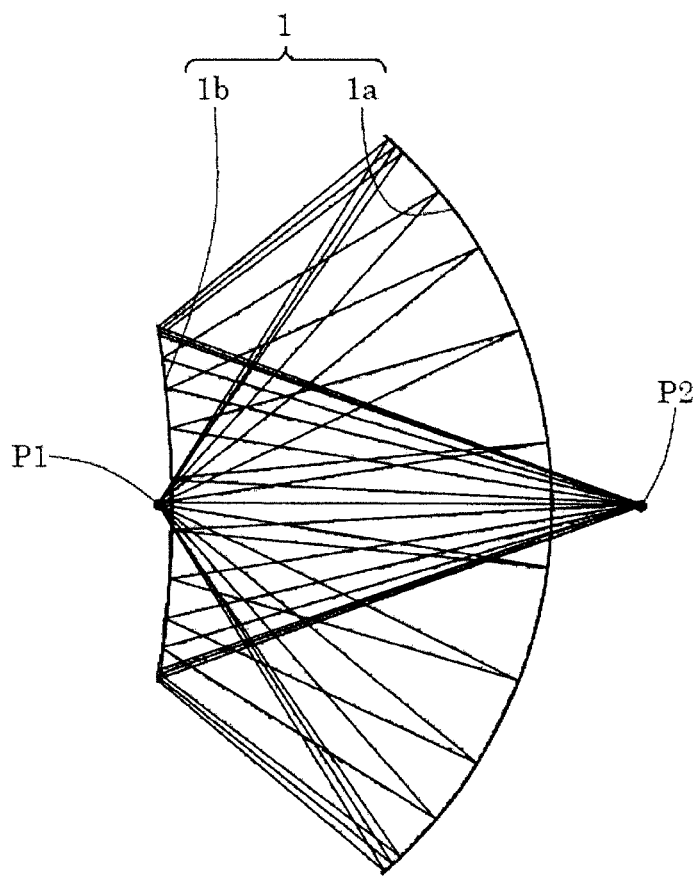
FIG. 5 is a first diagram schematically showing a construction of a collector optical member according to the embodiment.
Figure 5:
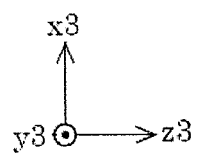
Figure 6:
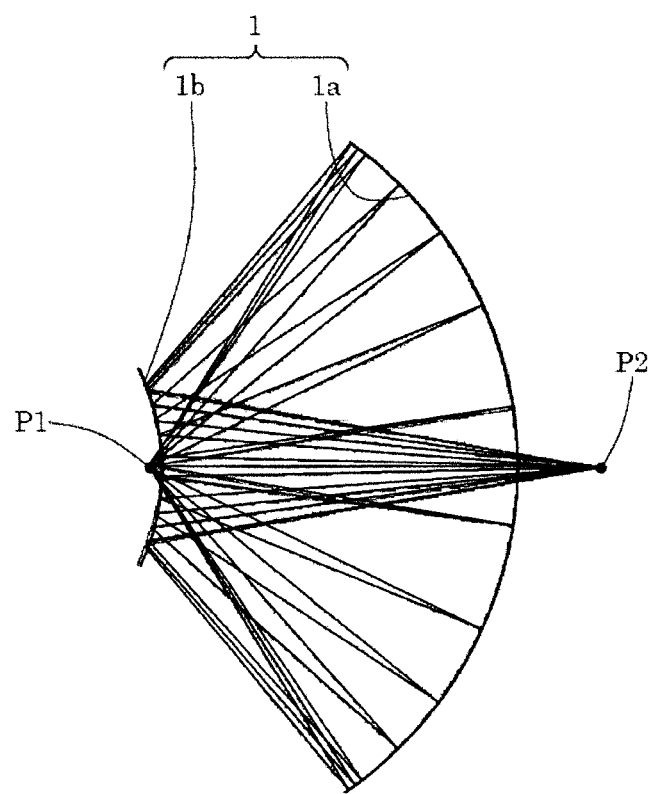
FIG. 6 is a second diagram schematically showing the construction of the collector optical member according to the embodiment.

FIGS. 5 and 6 are diagrams schematically showing a construction of a collector optical member according to the embodiment. In FIGS. 5 and 6, an x3 direction and a y3 direction are defined as directions corresponding to the x1 direction and the y1 direction respectively in the incident surface of the first fly's eye optical member 31 (a second area), and a z3 direction is defined as a direction perpendicular to both the x3 direction and the y3 direction. That is, in FIGS. 5 and 6, the y3 direction corresponds to the Y direction which is the scanning direction while the x3 direction corresponds to the X direction perpendicular to the scanning direction. FIG. 5 shows the light rays along the x3-z3 plane while FIG. 6 shows the light rays along the y3-z3 plane.

The following table (1) shows the value of each element of the collector optical member according to the embodiment. Descriptions in the table (1) are made in accordance with the format of "Code V" which is an optical design software product by ORA (Optical Research Associates). In the table (1), RDY indicates the curvature radius of a surface (or the apical curvature radius of an aspheric surface; unit: mm); THI indicates the distance from a present surface to the next surface i.e. a surface interval (unit: mm); and RMD indicates whether a present surface is a reflecting surface or a refracting surface. REFL means reflecting surface. INFINITY means infinitely great, and if RDY is INFINITY then it means that the relevant surface is a flat surface.

OBJ indicates the light-emitting point P1; STO indicates the surface of a virtual aperture stop; and IMG indicates the light condensing point P2. Surface No. 1 indicates a virtual surface; Surface No. 2 indicates the reflecting surface of the concave-surface reflecting mirror 1a as the first reflecting mirror; and Surface No. 4 indicates the reflecting surface of the convex-surface reflecting mirror 1b as the second reflecting mirror. SPS ZRN means that the reflecting surfaces of the respective reflecting mirrors 1a and 1b are aspheric surfaces denoted by power series. The notations of the table (1) is the same as in the aftermentioned table (2), except for the expression of aspheric surface.

TABLE (1)

| | RDY | THI | RMD | GLA |
|---|---|---|---|---|
| OBJ: | INFINITY | 0.000000 | | |
| 1: | INFINITY | 1500.000124 | | |
| 2: | −432.83272 | −949.999641 | REFL | |
| | SPS ZRN: SCO | | | |
| | K: −9.4341E−01 | ZP4: −1.8270E−05 | ZP5: 4.3276E−04 | |
| | ZP11: 4.3260E−13 | ZP12: −1.9463E−12 | ZP13: 1.0935E−11 | |
| | ZP22: −2.6779E−20 | ZP23: −6.7188E−20 | ZP24: −7.5913E−20 | |
| | ZP25: 4.5844E−19 | ZP38: −2.9880E−29 | ZP39: −3.1230E−27 | |
| | ZP40: 2.1408E−26 | ZP41: 2.6357E−27 | ZP56: 1.1351E−33 | |
| | ZP57: −1.6723E−33 | ZP58: −3.4764E−34 | ZP59: 7.2244E−34 | |
| | ZP60: −4.0069E−33 | ZP61: 3.9159E−33 | | |
| STO: | INFINITY | −500.000000 | | |
| 4: | −0.00000 | 1800.000000 | REFL | |
| | SPS ZRN: SCO | | | |
| | K: −1.4290E+33 | ZP4: −2.5757E−04 | ZP5: −1.9264E−04 | |
| | ZP11: −3.4980E−11 | ZP12: 3.1541E−12 | ZP13: 4.8114E−11 | |
| | ZP22: −8.3924E−17 | ZP23: 6.3352E−17 | ZP24: 3.2097E−17 | |
| | ZP25: −5.6027E−17 | ZP38: 7.4668E−23 | ZP39: −5.3416E−24 | |
| | ZP40: 1.9365E−23 | ZP41: 5.7693E−23 | ZP56: 2.3481E−28 | |
| | ZP57: 3.9143E−29 | ZP58: 1.4709E−30 | ZP59: 2.1537E−29 | |
| | ZP60: 8.3116E−30 | ZP61: −1.0180E−29 | | |
| IMG: | INFINITY | 0.000000 | | |

In the embodiment, the divergent light emitted from the light-emitting point P1 has a constant spread angle independent of direction and a circular cross section. This divergent light having a circular cross section is converted into a light flux having an elliptical cross section with the major axis in the x3 direction and the minor axis in the y3 direction via the aspheric reflecting surface of the concave-surface reflecting mirror 1a and the aspheric reflecting surface of the convex-surface reflecting mirror 1b, and is condensed at the point P2. As a result, the light flux coming into the first fly's eye optical member 31 via the light condensing point P2 has an elliptical cross section with the major axis in the x1 direction and the minor axis in the y1 direction. In the embodiment, the ratio between the major axis and the minor axis of the cross section of the incident light flux on the first fly's eye optical member 31 is 2 to 1.

Further, in the above embodiment, the light source unit LU of DPP type is used. However, without being limited to this, it is also possible to use a light source unit LU' of LPP (Laser Produced Plasma) type in a first modification such as that shown in FIG. 7. In the light source unit LU' of LPP type, laser light is condensed on a target, and plasma is produced by the target to obtain EUV light.

The first modification shown in FIG. 7 has a similar construction to that of the embodiment shown in FIG. 1. However, the first modification shown in FIG. 7 uses the light source unit LU' Of LPP type instead of the light source unit LU of DPP type and uses a collector optical member 11 constructed to adapt to the light source unit LU' of LPP type. This aspect differs from that of the embodiment shown in FIG. 1. Hereinbelow, focused on the difference with respect to the embodiment shown in FIG. 1, the construction and function of the first modification shown in FIG. 7 will be explained.

The light source apparatus according to the embodiment includes the light source unit LU' and the collector optical member 11. The light source unit LU' includes a laser light source 21, a condensing lens 22, a nozzle 23, and a duct 24. In the light source unit LU', a high-pressure gas composed of such as xenon (Xe) is supplied from the nozzle 23, and the gas jetted from the nozzle 23 forms a gas target 25. Then, the light (non-EUV light) emitted from the laser light source 21 is condensed on the gas target 25 via the condensing lens 22.

The gas target 25 obtains energy from the condensed laser light to produce plasma, and emits EUV light. That is, the position of the gas target 25 is the light-emitting point P1. The EUV light emitted from the light-emitting point P1 of the light source unit LU' is condensed by the collector optical member 11 having a similar form to an elliptical concave-surface reflecting mirror, and is then guided to the first fly's eye optical member 31 via the collimator optical member 2. The gas having finished light emission is sucked and guided to the outside through the duct 24.

FIGS. 8 and 9 are diagrams schematically showing a construction of the collector optical member according to the first modification shown in FIG. 7. In FIGS. 8 and 9, an x4 direction and a y4 direction are defined as directions corresponding to the x1 direction and the y1 direction respectively in the incident surface (light-receiving surface) of the first fly's eye optical member 31, and a z4 direction is defined as a direction perpendicular to both the x4 direction and the y4 direction. That is, in FIGS. 8 and 9, the y4 direction corresponds to the Y direction which is the scanning direction while the x3 direction corresponds to the X direction perpendicular to the scanning direction. FIG. 8 shows the light rays along the x4-z4 plane while FIG. 9 shows the light rays along the y4-z4 plane. The following table (2) shows the value of each element of the collector optical member according to the first modification. In the table (2), the section of "Data in the x4 direction" shows the data concerning the light rays along the x4-z4 plane in FIG. 8, while the section of "Data in the y4 direction" shows the data concerning the light rays along the y4-z4 plane in FIG. 9. OBJ indicates the light-emitting point P1; Surface No. 1 indicates a virtual surface; STO indicates the reflecting surface of the concave-surface reflecting mirror constituting the collector optical member 11; and IMG indicates light condensing points P2x and P2y. ASP means an aspheric surface expressed as power series.

through the light-emitting point P1 corresponds to part of an ellipse having one focal point at the light-emitting point P1 and having the other focal point at the point P2x. Further, as shown in FIG. 9, the intersection between the reflecting surface of the collector optical member 11 and a plane parallel to the y4-z4 plane through the light-emitting point P1 corresponds to part of another ellipse having one focal point at the light-emitting point P1 and having the other focal point at the point P2y.

In the first modification, the divergent light supplied from the light-emitting point P1 also has a constant spread angle independent of direction and a circular cross section. In this divergent light having a circular cross section, the light rays along the x4-z4 plane are condensed at the point P2x, via the aspheric reflecting surface of the collector optical member 11, while the light rays along the y4-z4 plane are condensed at the point P2y, away from the collector optical member 11 farther than the P2x via the aspheric reflecting surface of the collector optical member 11. In this manner, the divergent light having a circular cross section from the light-emitting point P1 is converted, via the aspheric reflecting surface of the collector optical member 11, into a light flux having an elliptical cross section with the major axis in the x4 direction and the minor axis in the y4 direction.

As a result, the incident light flux on the first fly's eye optical member 31 has an elliptical cross section with the major axis in the x1 direction and the minor axis in the y1 direction. In the first modification, the ratio between the major axis and the minor axis of the cross section of the incident light flux on the first fly's eye optical member 31 is 1.1 to 1. The collector optical member 11 reflects the light from the light source unit LU', and condenses the same to form a primary image of the light source. In the first modification, the condensing point P2x of the light rays along the x4-z4 plane does not coincide with the condensing point P2y of the light rays along the y4-z4 plane. Therefore, it is difficult to sufficiently narrow the light flux on the mirror elements 32a of the second fly's eye optical member 32. However, there are no particular problems if the light source

TABLE (2)

| | RDY | THI | RMD | GLA |
|---|---|---|---|---|
| | | <Data in the x4 direction> | | |
| OBJ: | INFINITY | 0.000000 | | |
| 1: | INFINITY | 150.000000 | | |
| STO: | −256.06602 | 874.264069 | REFL | |
| ASP: | | | | |
| K: | −0.500000 | | | |
| IC: | YES | CUF: 0.000000 | | |
| | A: 0.000000E+00 | B: 0.000000E+00 | C: 0.000000E+00 | D: 0.000000E+00 |
| IMG: | INFINITY | 0.000000 | | |
| | | <Data in the y4 direction> | | |
| OBJ: | INFINITY | 0.000000 | | |
| 1: | INFINITY | 150.000000 | | |
| STO: | −266.18950 | −1180.947502 | REFL | |
| ASP: | | | | |
| K: | −0.600000 | | | |
| IC: | YES | CUF: 0.000000 | | |
| | A: 0.000000E+00 | B: 0.000000E+00 | C: 0.000000E+00 | D: 0.000000E+00 |
| IMG: | INFINITY | 0.000000 | | |

In the first modification shown in FIG. 7, as shown in FIG. 8, the intersection between the reflecting surface of the concave-surface reflecting mirror constituting the collector optical member 11 and a plane parallel to the x4-z4 plane is small enough in size and the light flux does not spread out (go out) the contour of the mirror elements 32a.

In the collector optical member 11 according to the first modification, in the incident light flux on the first fly's eye optical member 31 of the optical integrator 3, for example, the light rays propagating within the y4-z4 plane are condensed at the condensing position P2y between the mask M and the light-emitting point P1 of the light source unit LU' (i.e. the light source), while the light rays propagating within the x4-z4 plane are condensed at the condensing position P2x between the condensing position P2y and the light-emitting point P1 of the light source unit LU'.

To express it in another way, in the light from the light source unit LU', the light rays to be condensed at the condensing position P2y between the mask M and the light-emitting point P1 of the light source unit LU' propagate through the y4-z4 cross section of the condensing surface of the concave-surface reflecting mirror constituting the collector optical member 11. At the same time, the light rays to be condensed at the condensing position P2x between the condensing position P2y and the light-emitting point P1 of the light source unit LU' propagate through the x4-z4 cross section of the condensing surface. In the collector optical member 11, the curvature of the condensing surface differs between the y4-z4 cross section including the y4 direction, and the x4-z4 cross section including the x4 direction (the cross section perpendicular to the y4-z4 cross section). For example, the curvature radius of the x4-z4 cross section is larger than that of the y4-z4 cross section with respect to the condensing surface.

That is, in the first modification shown in FIG. 7, the X direction is the direction in which the light condensed by the condensing surface of the x4-z4 cross section of the collector optical member 11 is projected in the superposed illumination area by the optical systems (2 to 5) between the collector optical member 11 and the superposed illumination area on the mask M (the first area). Further, the Y direction is the direction in which the light condensed by the condensing surface of the y4-z4 cross section of the collector optical member 11 is projected in the superposed illumination area by the optical systems (2 to 5).

Further, in the above explanations, the plurality of first mirror elements 31a of the first fly's eye optical member 31 correspond optically to the plurality of second mirror elements 32a of the second fly's eye optical member 32. Here, The term "correspond optically" means that, as shown in FIG. 10 for example, the light reflected by one of the plurality of first mirror elements 31a is reflected by any one of the plurality of second mirror elements 32a. In particular, in FIG. 10, the light rays reflected by the first mirror elements 31a1, 31a2, 31a3, 31a4 and 31a5 comes into the second mirror elements 32a1, 32a2, 32a3, 32a4 and 32a5, respectively.

That is, the first mirror element 31a1 corresponds optically to the second mirror element 32a1. Likewise, the first mirror elements 31a2 to 31a5 correspond optically to the second mirror elements 32a2 to 32a5, respectively. However, the plurality of first mirror elements 31a do not need to correspond to the plurality of second mirror elements 32a in a one-to-one manner, but the light reflected by one first mirror element and the light reflected by another first mirror element may be reflected by one identical second mirror element. Alternatively, there may be some second mirror elements which do not reflect the light reflected by the first mirror elements. When changing the illumination condition, it is possible to change the optically corresponding relation between the plurality of first mirror elements and the plurality of second mirror elements.

Further, even with an elliptical intensity distribution in the cross section of the incident light flux on the first fly's eye optical member 31, it is still possible to form a circular intensity distribution in the cross section (pupil plane) of the incident light flux on the second fly's eye optical member 32. Further, the intensity distribution in the pupil plane is not limited to a circular shape, but may be bipolar, quadrupolar, ring-like, square, elliptical, and the like. In such cases, it is still possible to equalize the resolving power of the pattern formed on the wafer W in two orthogonal directions (for example, the X direction and the Y direction). At this time, it is possible to adjust the optically corresponding relation between the plurality of first mirror elements and the plurality of second mirror elements.

Nevertheless, in the first modification shown in FIG. 7, the curvature radius of the condensing surface of the collector optical member 11 differs between the y4-z4 cross section including the y4 direction and the x4-z4 cross section including the x4 direction. Thus the condensing point P2x of the light along the x4-z4 plane does not coincide with the condensing point P2y of the light along the y4-z4 plane in the optical axis direction. As a result, a defocused light source image 41 (a secondary image of the light source) is formed, as shown in FIG. 11, in the reflecting surface of one second mirror element 32a of the second fly's eye optical member 32.

Because astigmatism arises from the influence of the cross-sectional shape of the light flux wavefront-divided by the first fly's eye optical member 31 (i.e. an anisotropic influence of the curvature of the condensing surface of the collector optical member 11), the profile of the light source image 41 becomes longer in one direction than in another. There are no particular problems if the light source image 41 (i.e. the incident light flux on the second mirror element 32a) does not spread out the contour of the reflecting surface of the second mirror element 32a. However, if the light source image 41 is too large and consequently spreads out the contour of the reflecting surface of the second mirror element 32a, then it not only gives rise to light loss but also unavoidably causes the overlap error of illuminating fields to occur in the superposed illumination area on the mask M.

Generally, in order to uniformize the illuminance distribution in the superposed illumination area on the mask M, there is a tendency to increase the number of wavefront divisions at the first fly's eye optical member 31, that is, a tendency to reduce the size of the reflecting surfaces of the first mirror element 31a and the second mirror element 32a. Reducing the size of the second mirror element 32a brings about a higher possibility that the light source image 41 spreads out the contour of the reflecting surface of the second mirror element 32a to give rise to light loss and collapse of the superposed illumination area.

In a second modification, the reflecting surface of one first mirror element 31a is shaped into a toroidal surface to keep a small size of a light source image 42 formed on one second mirror element 32a as schematically shown in FIG. 12, and furthermore, to avoid the occurrence of light loss and collapse of the superposed illumination area. In particular, in the second modification, the reflecting surface of the first mirror element 31a is formed into a toroidal surface with different surface curvatures from each other along the x1 direction and along the y1 direction.

In other words, a required curvature along the x1 direction and a required curvature along the y1 direction are given to the reflecting surface of the first mirror element 31a such that the light source image 41, which is elongated in one direction and obtained as the reflecting surface of the first mirror element 31a is spherical, may become the light source image 42 which is comparatively small in size and not much defocused as a whole. As a result, the reflecting surface of the first mirror element 31a has different curvatures from each other along the x1 direction and along the y1 direction.

However, if the size of the light source image 42 is too small, then the multilayer film forming the reflecting surface of the second mirror element 32a may become liable to thermal deformation and/or damage due to light illumination. In such cases, by appropriately adjusting the curvatures of the reflecting surface of the first mirror element 31a along the x1 direction and along the y1 direction, as shown in FIG. 13, it is possible to actively form a light source image 43 comparatively large in size and substantially defocused as a whole, thereby diminishing thermal deformation and damage of the multilayer film.

As a particular numerical example, with respect to the condensing surface of the concave-surface reflecting mirror constituting the collector optical member 11, the ratio between the curvature Cy4 along the y4 direction and the curvature Cx4 along the x4 direction may be, for example, 5 to 6 or 7 to 8. In such cases, it is possible to set the ratio between the curvature Cx1 along the x1 direction and the curvature Cy1 along the y1 direction to be, for example, 5 to 6, 6 to 5, 7 to 8, or 8 to 7, for the reflecting surface of the first mirror element 31a. Then, when the ratio between the curvature Cy4 and the curvature Cx4 is 5 to 6 with the collector optical member 11, provided the ratio between the curvature Cx1 and the curvature Cy1 is set to be 5 to 6 for the first mirror element 31a, then it is possible to obtain the light source image 42 comparatively small in size in the second mirror element 32a and, furthermore, to avoid the occurrence of light loss and collapse of the superposed illumination area.

Further, when the ratio between the curvature Cy4 and the curvature Cx4 is 5 to 6 with the collector optical member 11, provided the ratio between the curvature Cx1 and the curvature Cy1 is set to be 7 to 8 for the first mirror element 31a, then it is possible to obtain the light source image 43 comparatively large in size in the second mirror element 32a and, furthermore, to diminish thermal deformation and damage of the multilayer film. At this time, if it is possible to correct (compensate) for the influence on the illumination efficiency on the mask M due to the varying curvatures with direction in the condensing surface of the collector optical member 11 and in the reflecting surface of the first mirror element 31a by adjusting the relation between the curvature of the collector optical member 11 and the curvature of the first mirror element 31a, then the reflecting surface of the second mirror element 32a may be spherical as it is. If it is not possible to perform the correction by adjusting the curvature relation between the collector optical member 11 and the first mirror element 31a, then it is possible to perform the correction by forming the reflecting surface of the second mirror element 32a into the shape of a required toroidal surface.

In the second modification, it is not necessary to form a toroidal reflecting surface for every first mirror element 31a. By forming a toroidal reflecting surface each for a necessary number (at least one) of the reflecting surface of the first mirror elements 31a, it is still possible to obtain the effect of avoiding the occurrence of light loss and collapse of the superposed illumination area, or the effect of diminishing thermal deformation and damage of the multilayer film. These effects are obtainable by satisfying the following formula (7), for example, in terms of the curvature Cx1 along the x1 direction and the curvature Cy1 along the y1 direction with respect to the reflecting surface of one first mirror element 31a.

$$1.0 < Cx1/Cy1 < 1.2, \text{ or } 1.0 < Cy1/Cx1 < 1.2 \tag{7}$$

In the above explanations, a technique of forming a toroidal reflecting surface for the reflecting surface of the first mirror element 31a is applied to the construction of the first modification shown in FIG. 7. However, without being limited to the construction of the first modification shown in FIG. 7, it is also possible to apply the technique of forming a toroidal reflecting surface for the reflecting surface of the first mirror element 31a to the construction of the embodiment shown in FIG. 1. In the construction of the embodiment shown in FIG. 1, the condensing points P2 of the light from the collector optical member 1 coincide with each other independently of direction.

As a result, as shown in the left-hand figure of FIG. 14, the light source image 42 comparatively small in size is formed on the reflecting surface of one second mirror element 32a, and the multilayer film may be liable to thermal deformation and/or damage due to light illumination. In such cases, in the construction of the embodiment shown in FIG. 1, by appropriately adjusting the curvature Cx1 along the x1 direction and the curvature Cy1 along the y1 direction with the reflecting surface of the first mirror element 31a, as shown in the right-hand figure of FIG. 14, it is also possible to actively form the light source image 43 comparatively large in size and substantially defocused as a whole, thereby diminishing thermal deformation and damage of the multilayer film.

In the above manner, in the illumination optical system IL according the above embodiment and modifications, the first area longer in the X direction than in the Y direction, typically the circular-arc-shaped superposed illumination area elongated in the X direction, is formed on the pattern surface of the mask M. The optical apparatus of a first aspect includes the collector optical member 1 (11) which is arranged in an optical path between the light source unit LU (LU') and the mask M, and condenses the light from the light source unit LU (LU') to form, on a predetermined plane, the second area (the incident light flux area of an elliptical shape with the major axis in the x1 direction and the minor axis in the y1 direction) longer in the x1 direction (corresponding to the X direction) than in the y1 direction (corresponding to the Y direction); and the first fly's eye optical member 31 having the plurality of first mirror elements 31a which are provided within the predetermined plane including the second area to guide the light from the collector optical member 1 (11) to the first area.

The optical apparatus of a second aspect includes the first fly's eye optical member 31 which is provided in an optical path between the light source unit LU (LU') and the mask M, and aligns, in a predetermined plane, the plurality of first mirror elements 31a having a profile longer in the x1 direction (corresponding to the X direction) than in the y1 direction (corresponding to the Y direction) while an aggregate of the aligned first mirror elements 31a has different lengths from each other in the y1 direction and in the x1 direction; and the second fly's eye optical member 32 which is provided in an optical path between the first fly's eye optical member 31 and the mask M, and has the plurality of second mirror elements 32a arranged to correspond optically to the first mirror elements 31a.

The optical apparatus of a third aspect includes the first fly's eye optical member 31 which is provided within a predetermined plane including the second area (the incident light flux area of an elliptical shape with the major axis in the x1 direction and the minor axis in the y1 direction), and has the plurality of first mirror elements 31a. At least one mirror element of the plurality of first mirror elements 31a has an optical surface (i.e. a reflecting surface) with different surface curvatures from each other along the y1 direction (a third direction) and along the x1 direction (a fourth direction) within the surface perpendicular to the second area. Generally, if the first optical elements constituting the first fly's eye optical member are reflecting members, then the optical surface with different curvatures from each other in two directions is a reflecting surface, a diffracting surface, or the like. On the other hand, if the first optical elements are light-transmissive members, then the optical surface with different curvatures from each other in two directions is a lens surface, a diffracting surface, or the like.

In the illumination optical system IL according the above embodiment and modifications, it is possible to restrain distortion from occurring without causing the optical integrator 3 to grow in size and, furthermore, to illuminate the mask M under a required illumination condition capable of achieving a high light efficiency while keeping the occurrence of light loss due to the overlap error of illuminating fields at a low level. As a result, in the exposure apparatus according to the above embodiment and modifications, it is possible to carry out a favorable exposure under a favorable illumination condition by using the illumination optical system IL illuminating the mask M under a required illumination condition capable of achieving a high light efficiency while keeping the light loss small.

In the first aspect and the second aspect, it may be configured that the second area (the incident light flux area of an elliptical shape with the major axis in the x1 direction and the minor axis in the y1 direction; the area of the incident light flux on the first fly's eye optical member 31) is longer in the x1 direction than in the y1 direction by 1.1 times or more. Further, provided the aspect ratio of the second area is 1 to $\alpha$ in length between the y1 direction and the x1 direction, then it may be configured to satisfy the condition of $\alpha=1.1$ or more. Further, it is possible to let $\alpha$ not exceed 4.0.

In the first aspect and the second aspect, with the configuration of aligning the mirror elements 31a of the optical integrator 3 only within the second area, it is possible to further diminish light loss. Further, it is also possible to configure the aggregate of the mirror elements 31a to be longer in the x1 direction than in the y1 direction by 1.1 times or more. Further, provided the aspect ratio of the aggregate of the mirror elements 31a is 1 to $\alpha$ in length between the y3 direction and the x1 direction, then it may be configured to satisfy the condition of $\alpha=1.1$ or more. Further, it is possible to let $\alpha$ not exceed 4.0.

In the first aspect and the second aspect, it is possible to configure the cross section of the incoming light flux to the optical integrator 3 (furthermore, the incident light flux on the first fly's eye optical member 31) to be longer in the x1 direction than in the y1 direction by 1.1 times or more. Further, provided the aspect ratio of the cross section of the incoming light flux to the optical integrator 3 is 1 to $\alpha$ in length between the y1 direction and the x1 direction, then it may be configured to satisfy the condition of $\alpha=1.1$ or more. Further, it is possible to let $\alpha$ not exceed 4.0.

Further, in the above embodiment and modifications, the illumination area elongated in the X direction intersecting the Y direction, i.e., the circular-arc-shaped illumination area elongated in the X direction, is formed on the pattern surface of the mask M. The first fly's eye optical member 31 of the optical integrator 3 is constructed by aligning the plurality of mirror elements 31a having a profile corresponding to the illumination area, i.e., a circular arc profile elongated in the x1 direction (corresponding to the X direction), in the y1 direction (corresponding the Y direction) and in the x1 direction. In the first fly's eye optical member 31, the aggregate of the aligned mirror elements 31a has different lengths from each other in the y1 direction and in the x1 direction.

To express it in another way, the light-receiving surface (incident surface) of the first fly's eye optical member 31 has different lengths from each other in the y1 direction and in the x1 direction. To express it in still another way, the light-receiving surface of the first fly's eye optical member 31 has different numbers of the elements aligned in the y1 direction and in the x1 direction. By this configuration, in the above embodiment and modifications, it is possible to restrain distortion from occurring without causing the optical integrator 3 to grow in size and, furthermore, to keep the occurrence of light loss due to the overlap error of illuminating fields at a low level. As a result, in the exposure apparatus according to the above embodiment and modifications, it is possible to carry out a favorable exposure under a favorable illumination condition by using the illumination optical system IL provided with the optical integrator 3 keeping the light loss small to illuminate the mask M under a required illumination condition capable of achieving a high light efficiency.

Provided the aspect ratio of the aggregate of the aligned mirror elements 31a is 1 to $\alpha$ between the y1 direction and the x1 direction, then it may be configured to satisfy the condition of $\alpha=1.1$ or more. Further, it is also possible to configure the aggregate of the aligned mirror elements 31a to be longer in the x1 direction than in the y1 direction by 1.1 times or more. Further, it is also possible to configure the aggregate of the mirror elements 31a with 20 rows or more aligned in the y1 direction and 5 rows or more aligned in the x1 direction.

Further, while the collimator optical member 2 is provided between the collector optical member 1 and the optical integrator 3 in the above explanations, it is not limited to this configuration. That is, the optical apparatus may also be configured to cause the light from the light source unit LU (LU') to come into the first fly's eye optical member 31 of the optical integrator 3 without passing an optical member having power (an optical member such as the collimator optical member 2). Here, the power of an optical member is the reciprocal of the focal distance of that optical member.

Further, the present teaching is explained above based on an exposure apparatus of near pupil type. Here, the exposure apparatus of near pupil type refers to an exposure apparatus including a projection optical system in which the entrance pupil is positioned on the projection optical system side with respect to the object surface (corresponding to the pattern surface of the mask M). However, without being limited to the exposure apparatus of near pupil type, it is also possible to apply the present teaching in the same manner to an exposure apparatus of far pupil type. The exposure apparatus of far pupil type refers to an exposure apparatus including a projection optical system in which the entrance pupil is positioned on the opposite side to the projection optical system across the object surface.

In particular, in the exposure apparatus of far pupil type, the light from the light source unit LU (LU') passes the collector optical member 1 (the collector optical member 11), and then comes into the optical integrator 3 in the illumination optical system IL via the collimator optical member 2. Thereafter, the light via the optical integrator 3 forms the circular-arc-shaped first area on the mask M via an oblique incident mirror (a flat-surface reflecting mirror).

That is, the light via the second fly's eye optical member 32 of the optical integrator 3 is guided to the pattern surface of the mask M as the irradiation surface not via any optical member having power (an optical member such as the condenser optical system 5). Further, it is also possible to interpose an optical member having power in the optical path between the optical integrator 3 and the irradiation surface. Further, it may also be configured not to interpose an optical member having power such as the collimator optical member 2 between the collector optical member 1 (11) and the optical integrator 3.

Further, in the above explanations, the first mirror elements 31a in the first fly's eye optical member 31 each have a circular arc profile, while the second mirror elements 32a in the second fly's eye optical member 32 each have a rectangular profile. However, without being limited to these profiles, various forms are adaptable for the profile of each optical element, as well as for the positive or negative power of each optical element. Further, it is also possible to use refracting optical elements or diffracting optical elements instead of the mirror elements.

In the above explanations, the ratio between the major axis and the minor axis of the cross section of the incident light flux on the first fly's eye optical member 31 is 2 to 1 or 1.1 to 1. However, the ratio between the major axis and the minor axis of the cross section of the incident light flux on the first fly's eye optical member 31 is not limited to this but can be α to 1 (where α=1.1 or more). Further, it is possible to make α to be not more than 4.0.

In the illumination method according to a sixth aspect, in the pattern surface of the mask M, the light from the light source unit LU (LU') forms the first area longer in the X direction than in the Y direction, i.e., the circular-arc-shaped superposed illumination area elongated in the X direction. This illumination method includes: condensing the light from the light source and guiding the same to the second area in a predetermined plane, wavefront-dividing the light into a plurality of light fluxes each having a profile longer in a fourth direction intersecting a third direction than in the third direction in the predetermined plane, and guiding the plurality of wavefront-divided light fluxes to the first area. The second area has a shape longer in the fourth direction than in the third direction (the incident light flux area long in the x1 direction but short in the y1 direction), and the plurality of light fluxes in the predetermined plane are aligned along the third direction and the fourth direction.

The optical apparatus producing method according to a ninth aspect is configured to produce an optical apparatus used for uniformly illuminating an illumination area longer in the X direction than in the Y direction with the light from the light source unit LU (LU'). The optical apparatus producing method includes obtaining a collector optical member forming, in a predetermined plane, the second area longer in a fourth direction intersecting a third direction than in the third direction (the incident light flux area long in the x1 direction but short in the y1 direction) by condensing the light from the light source, and setting the first fly's eye optical member having a plurality of first optical elements within the predetermined plane including the second area.

The optical apparatus producing method according to a tenth aspect is configured to produce an optical apparatus used for uniformly illuminating an illumination area longer in the X direction than in the Y direction with the light from the light source unit LU (LU'). The optical apparatus producing method includes preparing a plurality of first optical elements each having a profile longer in a fourth direction intersecting a third direction than in the third direction, and obtaining a first fly's eye optical member including such an aggregate of the plurality of first optical elements aligned in the third direction and the fourth direction as has different lengths from each other in the third direction and in the fourth direction.

In the above embodiment, instead of the mask M, a variable pattern formation apparatus can be used to form a predetermined pattern based on a predetermined electric data. Further, as the variable pattern formation apparatus, it is possible to use, for example, a spatial light modulation element including a plurality of reflecting elements to be driven based on the predetermined electric data. An exposure apparatus using such a spatial light modulation element is disclosed in, for example, U.S. Patent Application Publication No. 2007/0296936. Further, other than the reflective spatial light modulator of non-light-emitting type as mentioned above, it is also possible to use a transmissive spatial light modulator or an image display element of self-light-emitting type.

The exposure apparatus of the embodiment described above is produced by assembling the various subsystems including the respective constitutive elements as defined in claims so that the predetermined mechanical accuracy, electric accuracy and optical accuracy are maintained. In order to secure the various accuracies, those performed before and after the assembling include the adjustment for achieving the optical accuracy for the various optical systems, the adjustment for achieving the mechanical accuracy for the various mechanical systems, and the adjustment for achieving the electric accuracy for the various electric systems. The steps of assembling the various subsystems into the exposure apparatus include, for example, the mutual mechanical connection, wiring connection of the electric circuits, and piping connection of the air pressure circuits among the various subsystems. It goes without saying that the steps of assembling the respective individual subsystems are performed before performing the steps of assembling the various subsystems into the exposure apparatus. When the steps of assembling the various subsystems into the exposure apparatus are completed, the overall adjustment is performed to secure the various accuracies as the entire exposure apparatus. It is preferable that the exposure apparatus is produced in a clean room in which the temperature, the cleanness, etc. are managed.

Next, an explanation will be made about a device production method using the exposure apparatus or exposure method according to the above embodiment. FIG. 15 is a flowchart showing steps of producing a semiconductor device. As shown in FIG. 15, in the steps of producing the semiconductor device, a metal film is vapor-deposited on a wafer W which is to serve as a substrate of the semiconductor device (Step S40); and a photoresist as a photosensitive material is coated on the vapor-deposited metal film (Step S42). Subsequently, a pattern formed on a mask (reticle) M is transferred to each of shot areas on the wafer W by using the exposure apparatus of the embodiment described above (Step S44: exposure step). The wafer W for which the transfer has been completed is developed, i.e., the photoresist, to which the pattern has been transferred, is developed (Step S46: development step). After that, the resist pattern, which is generated on the surface of the wafer W in accordance with Step S46, is used as a mask to perform the processing including, for example, the etching with respect to the surface of the wafer W (Step S48: processing step).

The resist pattern herein refers to the photoresist layer formed with protrusions and recesses having shapes corresponding to the pattern transferred by the exposure apparatus of the embodiment described above, wherein the recesses penetrate through the photoresist layer. In Step S48, the surface of the wafer W is processed via the resist pattern. The processing, which is performed in Step S48, includes, for example, at least one of the etching of the surface of the wafer W and the film formation of a metal film or the like. In Step S44, the exposure apparatus of the embodiment described above transfers the pattern by using, as the photosensitive substrate, the wafer W coated with the photoresist.

In the embodiment described above, the present teaching is applied to the exposure apparatus having the light source for supplying the EUV light. However, there is no limitation to this. The present teaching is also applicable to an exposure apparatus having a light source for supplying light having any other wavelength than that of the EUV light.

In the embodiment described above, the present teaching is applied to the illumination optical system of the EUV exposure apparatus using the reflection-type mask M. However, there is no limitation to this. The present teaching is also applicable to an general illumination optical system illuminating the first area based on the light from the light source.

According to the embodiments as described above, it is possible to illuminate the irradiation surface under a required illumination condition capable of achieving a high light efficiency while keeping the occurrence of light loss at a low level. As a result, it is possible to achieve a high throughput.

The invention claimed is:

1. An illumination optical system which illuminates an illumination area on a first plane with a light from a light source, the illumination optical system comprising:
a first optical system which is arranged so as to cross a second plane which crosses the first plane, and which changes a cross sectional shape of the light from the light source to a first cross-sectional shape having a first dimension in a first direction along the second plane and a second dimension in a second direction crossing the first direction, the first dimension being smaller than the second dimension;
a first fly's eye optical member which includes a plurality of first reflection elements arranged in a first arrangement plane which crosses the second plane and which reflects the light from the first optical system; and
a second fly's eye optical member which includes a plurality of second reflection elements arranged in a second arrangement plane which crosses the second plane and which reflects the light from the first fly's eye optical member; wherein
the first fly's eye optical member reflects the light from the first optical system so that the light from the first fly's eye optical member has a second cross-sectional shape on the second arrangement plane, the second cross-sectional shape having a third dimension in a third direction along the second plane and a fourth dimension in a fourth direction crossing the third direction, the third dimension divided by the fourth dimension being larger than the first dimension divided by the second dimension.

2. The illumination optical system according to claim 1, wherein a fifth direction is defined in the first plane along an intersection between the first plane and the second plane, and a sixth direction is defined in the first plane so as to cross the fifth direction,
the illumination area has a fifth dimension in the fifth direction and a sixth dimension in the sixth direction, the fifth dimension being smaller than the sixth dimension.

3. The illumination optical system according to claim 1, wherein the light reflected by the plurality of first reflection elements travels away from the light coming into the plurality of first reflection elements, in the first direction.

4. The illumination optical system according to claim 1, wherein a focal distance of the first optical elements with respect to the first direction and a focal distance of the first optical elements with respect to the second direction are different from each other.

5. The illumination optical system according to claim 1, wherein the light source includes a condenser optical system which condenses the light from the light source, and the first optical system reflects the light from the light source which has traveled via the condenser optical system.

6. The illumination optical system according to claim 5, wherein a fifth direction is defined in an incident plane of the first optical system, on which the light from the light source is incident, along an intersection between the incident plane and the second plane, and a sixth direction is defined in the incident plane so as to cross the fifth direction,
the light coming into the incident plane has a fifth dimension in the fifth direction and a sixth dimension in the sixth direction, the fifth dimension divided by the sixth dimension being larger than the first dimension divided by the second dimension.

7. The illumination optical system according to claim 1, wherein a fifth direction is defined in an incident plane of the first optical system, on which the light from the light source is incident, along an intersection between the incident plane and the second plane, and a sixth direction is defined in the incident plane so as to cross the fifth direction,
the light coming into the incident plane has a fifth dimension in the fifth direction and a sixth dimension in the sixth direction, the fifth dimension divided by the sixth dimension being larger than the first dimension divided by the second dimension.

8. An exposure method comprising:
illuminating a pattern by using the illumination optical system as defined in claim 1, and
exposing an image of the pattern onto a workpiece.

9. A method for producing a device comprising:
exposing an image of a pattern onto a workpiece by using the exposure method as defined in claim 8;
developing the workpiece on which the image of the pattern has been transferred so as to form a mask layer which has a shape corresponding to the pattern on a surface of the workpiece; and
processing the surface of the workpiece via the mask layer.

10. An illumination optical system which illuminates an illumination area with a light from a light source, the illumination system comprising:
a first optical system which changes a cross-sectional shape of the light from the light source to a first cross-sectional shape having a first dimension in a first direction and a second dimension in a second direction that is larger than the first dimension, the first direction and the second direction being defined within a traversal plane which crosses the light travelling from the light source such that the second direction crosses the first direction;
a first fly's eye optical member which includes a plurality of first reflection elements arranged on a first arrangement plane and which reflects the light that travels from the first optical system along a first axis so that the reflected light travels along a second axis crossing the first axis; and a second fly's eye optical member which includes a plurality of second reflection elements arranged on a second arrangement plane and which reflects the light that travels from the first fly's eye optical member along the second axis, wherein the first direction is a direction defined in a plane including the first and second axes, a third direction is defined in the second arrangement plane along the plane including the first and second axes and a fourth direction is defined in the second arrangement plane so as to cross the third direction, the first fly's eye optical member reflects the light from the first optical system so that the reflected light has a second cross-sectional shape on the second arrangement plane, the second cross-sectional shape having a third dimension in the third direction and a fourth dimension in the fourth direction, the third dimension divided by the fourth dimension being larger than the first dimension divided by the second dimension.

11. The illumination optical system according to claim 10, wherein a fifth direction is defined on a plane, on which the illumination area is positioned, along an intersection between the plane on which the illumination area is positioned and the plane including the first and second axes, and a sixth direction is defined on the plane on which the illumination area is positioned so as to cross the fifth direction, the illumination area has a fifth dimension in the fifth direction and a sixth dimension in the sixth direction, the fifth dimension being smaller than the sixth dimension.

12. The illumination optical system according to claim 10, wherein the light reflected by the plurality of first reflection elements travels away from the light coming into the plurality of first reflection elements, in the first direction.

13. The illumination optical system according to claim 10, wherein a focal distance of the first optical elements with respect to the first direction and a focal distance of the first optical elements with respect to the second direction are different from each other.

14. The illumination optical system according to claim 10, wherein the light source includes a condenser optical system which condenses the light from the light source, and the first optical system reflects the light from the light source which has traveled via the condenser optical system.

15. The illumination optical system according to claim 14, wherein a fifth direction is defined in an incident plane of the first optical system, on which the light from the light source is incident, along the plane including the first and second axes, and a sixth direction is defined in the incident plane so as to cross the fifth direction, the light coming into the incident plane has a fifth dimension in the fifth direction and a sixth dimension in the sixth direction, the fifth dimension divided by the sixth dimension being larger than the first dimension divided by the second dimension.

16. The illumination optical system according to claim 10, wherein a fifth direction is defined in an incident plane of the first optical system, on which the light from the light source is incident, along the plane including the first and second axes, and a sixth direction is defined in the incident plane so as to cross the fifth direction, the light coming into the incident plane has a fifth dimension in the fifth direction and a sixth dimension in the sixth direction, the fifth dimension divided by the sixth dimension being larger than the first dimension divided by the second dimension.

17. An exposure method comprising:

illuminating a pattern by using the illumination optical system as defined in claim 10, and exposing an image of the pattern onto a workpiece.

18. A method for producing a device comprising:

exposing an image of a pattern onto a workpiece by using the exposure method as defined in claim 17;

developing the workpiece on which the image of the pattern has been transferred so as to form a mask layer which has a shape corresponding to the pattern on a surface of the workpiece; and processing the surface of the workpiece via the mask layer.

* * * * *